(12) United States Patent
Shirakawa et al.

(10) Patent No.: US 12,431,448 B2
(45) Date of Patent: Sep. 30, 2025

(54) SEMICONDUCTOR DEVICE

(71) Applicant: FUJI ELECTRIC CO., LTD., Kanagawa (JP)

(72) Inventors: Tohru Shirakawa, Matsumoto (JP); Yasunori Agata, Matsumoto (JP); Naoki Saegusa, Matsumoto (JP); Kaname Mitsuzuka, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 468 days.

(21) Appl. No.: 17/890,261

(22) Filed: Aug. 17, 2022

(65) Prior Publication Data
US 2022/0392815 A1 Dec. 8, 2022

Related U.S. Application Data

(63) Continuation of application No. PCT/JP2021/014967, filed on Apr. 8, 2021.

(30) Foreign Application Priority Data
Sep. 11, 2020 (JP) .................. 2020-152944

(51) Int. Cl.
H01L 23/00 (2006.01)
H01L 21/66 (2006.01)
(Continued)

(52) U.S. Cl.
CPC ............ H01L 24/05 (2013.01); H01L 22/32 (2013.01); H01L 24/06 (2013.01); H10D 64/231 (2025.01);
(Continued)

(58) Field of Classification Search
CPC ......... H01L 24/05; H01L 22/32; H01L 24/06; H01L 23/296; H01L 2224/04042;
(Continued)

(56) References Cited

U.S. PATENT DOCUMENTS 5,153,696 A 10/1992 Kayama
11,264,495 B2 * 3/2022 Imagawa ............... H10D 8/422
(Continued)

FOREIGN PATENT DOCUMENTS

CN 204257660 U 4/2015
CN 110718519 A 1/2020
(Continued)

OTHER PUBLICATIONS

Office Action issued for counterpart Japanese Application No. 2022-547391, transmitted from the Japanese Patent Office on Aug. 22, 2023 (drafted on Aug. 18, 2023).
(Continued)

Primary Examiner — Jung Kim

(57) ABSTRACT

A semiconductor device including a semiconductor substrate, the semiconductor device including: a sensing portion that is provided on the semiconductor substrate and that is configured to detect predetermined physical information; a sensing pad portion that is provided above an upper surface of the semiconductor substrate and that is connected to the sensing portion; a gate runner which is provided above the upper surface of the semiconductor substrate and to which a gate potential is applied; and one or more separated conductive portions in which each separated conductive portion is provided between the sensing pad portion and the semiconductor substrate and that is separated from the gate runner.

21 Claims, 38 Drawing Sheets

(51) Int. Cl.
  *H10D 64/23*   (2025.01)
  *H01L 23/29*   (2006.01)
  *H10D 12/00*   (2025.01)
  *H10D 62/83*   (2025.01)
  *H10D 64/62*   (2025.01)

(52) U.S. Cl.
  CPC .. *H01L 23/296* (2013.01); *H01L 2224/04042* (2013.01); *H01L 2224/05012* (2013.01); *H01L 2224/05018* (2013.01); *H01L 2224/05019* (2013.01); *H01L 2224/05027* (2013.01); *H01L 2224/05082* (2013.01); *H01L 2224/05083* (2013.01); *H01L 2224/05166* (2013.01); *H01L 2224/05184* (2013.01); *H01L 2224/05186* (2013.01); *H01L 2224/05552* (2013.01); *H01L 2224/05553* (2013.01); *H01L 2224/05559* (2013.01); *H01L 2224/05573* (2013.01); *H01L 2224/05624* (2013.01); *H01L 2224/0603* (2013.01); *H01L 2224/06051* (2013.01); *H01L 2224/0615* (2013.01); *H01L 2924/04941* (2013.01); *H01L 2924/0715* (2013.01); *H01L 2924/13055* (2013.01); *H01L 2924/186* (2013.01); *H10D 12/481* (2025.01); *H10D 62/83* (2025.01); *H10D 64/62* (2025.01)

(58) Field of Classification Search
  CPC . H01L 2224/05012; H01L 2224/05018; H01L 2224/05019; H01L 2224/05027; H01L 2224/05082; H01L 2224/05083; H01L 2224/05166; H01L 2224/05184; H01L 2224/05186; H01L 2224/05552; H01L 2224/05553; H01L 2224/05559; H01L 2224/05573; H01L 2224/05624; H01L 2224/0603; H01L 2224/06051; H01L 2224/0615; H01L 2924/04941; H01L 2924/0715; H01L 2924/13055; H01L 2924/186; H01L 21/76816; H01L 21/76843; H01L 23/528; H01L 23/53266; H10D 64/231; H10D 12/481; H10D 62/83; H10D 64/62; H10D 64/519; H10D 62/127; H10D 64/232
  See application file for complete search history.

(56) References Cited

U.S. PATENT DOCUMENTS

| | | |
|---|---|---|
| 2006/0065925 A1 | 3/2006 | Yoshida |
| 2015/0014743 A1 | 1/2015 | Werber |
| 2015/0364587 A1 | 12/2015 | Yoshinaga |
| 2016/0163852 A1 | 6/2016 | Siemieniec |
| 2017/0018635 A1 | 1/2017 | Tsuyuki |
| 2017/0194438 A1 | 7/2017 | Kumagai |
| 2018/0269163 A1 | 9/2018 | Iwamizu |
| 2018/0374939 A1 | 12/2018 | Arai |
| 2019/0097030 A1 | 3/2019 | Miyata |
| 2019/0288082 A1 | 9/2019 | Sagawa |
| 2020/0020579 A1 | 1/2020 | Kato |
| 2020/0066665 A1 | 2/2020 | Okawara |
| 2020/0185520 A1 | 6/2020 | Imagawa |
| 2020/0203512 A1 | 6/2020 | Shirakawa |

FOREIGN PATENT DOCUMENTS

| | | |
|---|---|---|
| CN | 111341772 A | 6/2020 |
| JP | H04100276 A | 4/1992 |
| JP | 2003069021 A | 3/2003 |
| JP | 2007227556 A | 9/2007 |
| JP | 2014192351 A | 10/2014 |
| JP | 2016004877 A | 1/2016 |
| JP | 2016122835 A | 7/2016 |
| JP | 2018014392 A | 1/2018 |
| JP | 2018061009 A | 4/2018 |
| JP | 2019161181 A | 9/2019 |
| JP | 2020031154 A | 2/2020 |
| JP | 2020035847 A | 3/2020 |
| JP | 2020098881 A | 6/2020 |
| WO | 2016114057 A1 | 7/2016 |
| WO | 2017029748 A1 | 2/2017 |
| WO | 2017168735 A1 | 10/2017 |
| WO | 2018056233 A1 | 3/2018 |
| WO | 2019176327 A1 | 9/2019 |

OTHER PUBLICATIONS

Office Action issued for counterpart Japanese Application No. 2022-547390, transmitted from the Japanese Patent Office on Aug. 29, 2023 (drafted on Aug. 22, 2023).
(ISA/237) Written Opinion of the International Search Authority for International Patent Application No. PCT/JP2021/014967, issued/mailed by the Japan Patent Office on Jun. 29, 2021.
(ISA/237) Written Opinion of the International Search Authority for International Patent Application No. PCT/JP2021/014968, issued/mailed by the Japan Patent Office on Jun. 29, 2021.
Office Action issued for counterpart Japanese Application No. 2024-002288, transmitted from the Japanese Patent Office on Apr. 1, 2025 (drafted on Mar. 25, 2025).
Office Action issued for counterpart Chinese Application 202180016753.X, issued by The State Intellectual Property Office of People's Republic of China on Jul. 29, 2025.

* cited by examiner

SEMICONDUCTOR DEVICE

The contents of the following Japanese and PCT patent applications are incorporated herein by reference:
NO. 2020-152944 filed in JP on Sep. 11, 2020
NO. PCT/JP2021/014967 filed in WO on Apr. 8, 2021

BACKGROUND

1. Technical Field

The present invention relates to a semiconductor device.

2. Related Art

In the related art, a semiconductor device including a transistor or the like has been known (refer to, for example, Patent Documents 1 to 3).

[Patent Document 1] Japanese Patent Application Publication No. 2007-227556
[Patent Document 2] Japanese Patent Application Publication No. 2020-31154
[Patent Document 3] Japanese Patent Application Publication No. 2020-35847

DESCRIPTION OF EXEMPLARY EMBODIMENTS

Figure 1:
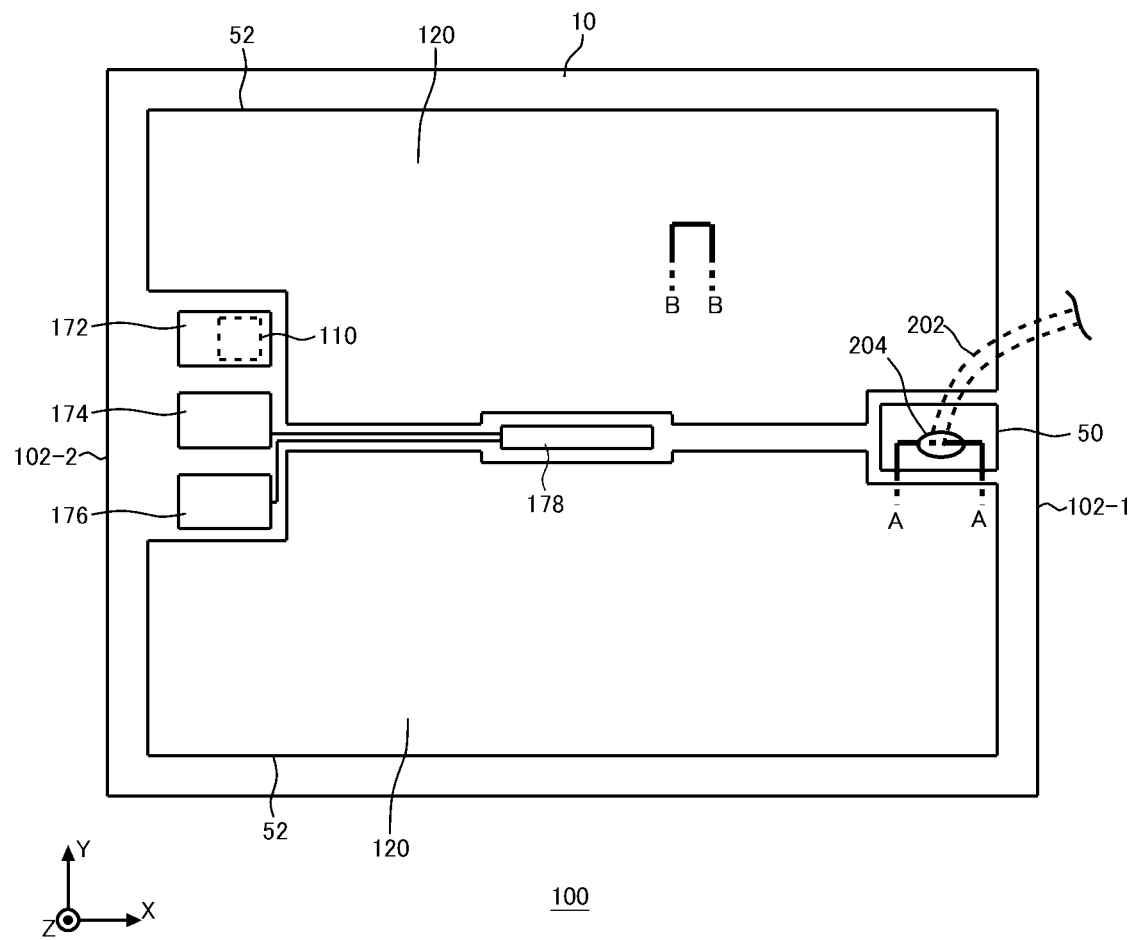
FIG. 1 is a top plan view showing an example of a semiconductor device 100.

Hereinafter, the present invention will be described through embodiments of the invention, but the following embodiments do not limit the invention according to the claims. In addition, not all of the combinations of features described in the embodiments are essential for means to solve the problem in the invention. It should be noted that in the present specification and the drawing, elements having substantially the same function and configuration are given the same signs and numerals to omit duplicate descriptions, and elements that do not directly relate to the present invention are omitted and are not illustrated. In addition, a sign and a numeral may be given to an element that represents elements having the same function and configuration in one drawing, and signs and numerals for other elements may be omitted.

In the present specification, one side in a direction parallel to a depth direction of a semiconductor substrate is referred to as an "upper" side, and the other side is referred to as a "lower" side. One surface of two principal surfaces of a substrate, a layer, or another member is referred to as an upper surface, and the other surface is referred to as a lower surface. "Upper" and "lower" directions are not limited to a direction of gravity, or a direction in which a semiconductor module is mounted.

In the present specification, technical matters may be described by using orthogonal coordinate axes of an X axis, a Y axis, and a Z axis. The orthogonal coordinate axes merely specify relative positions of components and do not limit a specific direction. For example, a direction that the Z axis shows is not limited to a height direction with respect to the ground. It should be noted that a +Z axis direction and a −Z axis direction are directions opposite to each other. In a case where a Z axis direction is described without a description of positive and negative signs, the direction means a direction parallel to the +Z axis and the −Z axis. In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, in a case where a phrase as "same" or "equal" is mentioned, the case may include a case where there is an error due to a variation in manufacturing or the like. The error is, for example, within 10%.

FIG. 1 is a top plan view showing an example of a semiconductor device 100. The semiconductor device 100 includes a semiconductor substrate 10, an emitter electrode 52, and a gate pad 50. The semiconductor substrate 10 is a substrate formed of a semiconductor material such as silicon or a compound semiconductor. The semiconductor substrate 10 has an edge side 102 in the top plan view. In the present specification, a position of each member is projected onto an upper surface of a predetermined member such as the semiconductor substrate 10 or the semiconductor device 100, which is referred to as the top plan view. The semiconductor substrate 10 of the present example has two sets of edge sides 102 opposite to each other in the top plan view. FIG. 1 shows a set of edge side 102-1 and edge side 102-2 opposite to each other. In FIG. 1, a direction parallel to the edge side 102-1 and the edge side 102-2 is the Y axis direction, and a direction perpendicular to the edge side 102-1 and the edge side 102-2 is the X axis direction.

The emitter electrode 52 and the gate pad 50 are electrodes containing metal such as aluminum. The emitter electrode 52 and the gate pad 50 are separated from each other in the top plan view. A protective member such as polyimide may be provided between the emitter electrode 52 and the gate pad 50. A dielectric film is provided between the emitter electrode 52 and the gate pad 50, and the semiconductor substrate 10. The emitter electrode 52 and the gate pad 50 are connected to the semiconductor substrate 10 or a member provided on an upper surface of the semiconductor substrate 10 via a contact hole provided in the dielectric film.

Figure 2A:
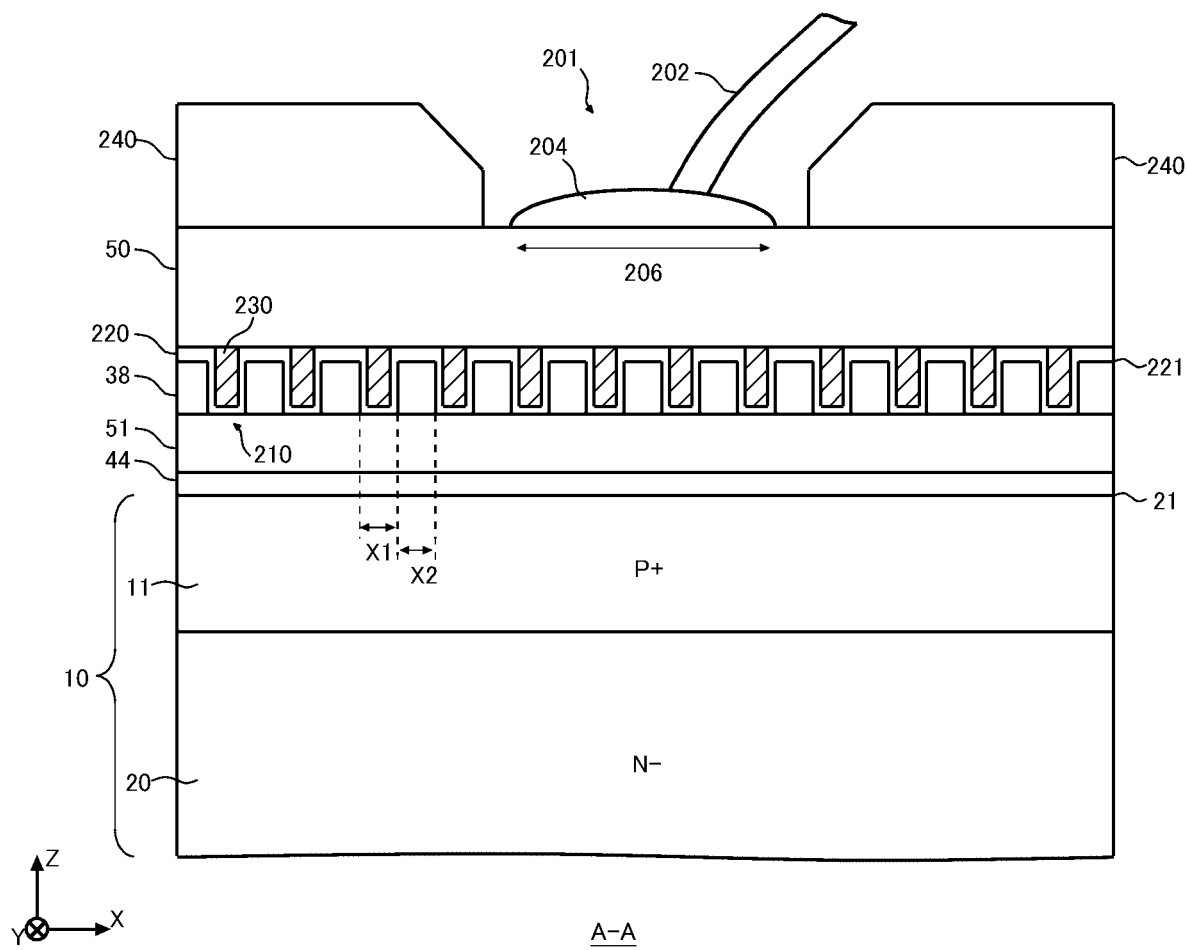
FIG. 2A is a figure showing an example of a cross section A-A in FIG. 1.
Figure 2B:
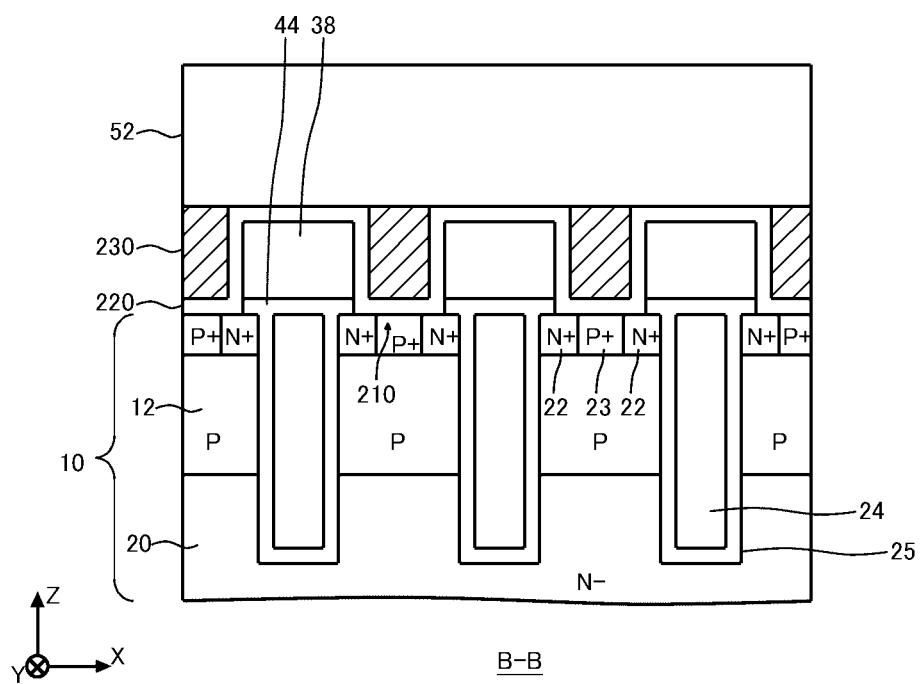
FIG. 2B is a figure showing an example of a cross section B-B in FIG. 1.

FIG. 2A is a figure showing an example of a cross section A-A in FIG. 1. The cross section A-A is an XZ plane passing through the gate pad 50 and a connection portion 204. FIG. 2B shows an example of a cross section B-B in FIG. 1. The cross section B-B is an XZ plane passing through the emitter electrode 52.

In FIG. 2B, the emitter electrode 52 is electrically connected to the semiconductor substrate 10 via a barrier metal layer 220 and a tungsten portion 230 in a contact hole (a through hole) 210 provided in an interlayer dielectric film 38. For example, the emitter electrode 52 may be connected to a source region 22 of a first conductivity type and a contact region 23 in an IGBT (an insulated gate bipolar transistor). Below the source region 22, a base region 12 of a P type is provided. As an example, the first conductivity type is an N type. A trench 25 may be provided on a front surface of the semiconductor substrate 10, and a gate electrode 24 may fill an inside of the trench 25 via a dielectric film 44. When a predetermined gate voltage is applied to the gate electrode 24, a channel is formed in the base region 12 in contact with the trench 25, and a current flows between the source region 22 and a drift region 20. The trench 25 of the present example is provided to extend in the Y axis direction on an upper surface 21 of the semiconductor substrate 10. That is, on the upper surface 21 of the semiconductor substrate 10, the trench 25 has a longitudinal length in the Y axis direction.

In FIG. 2A, the gate pad 50 is electrically connected to a wiring layer 51 via the barrier metal layer 220 and the tungsten portion 230 in the contact hole (the through hole) 210 provided in the interlayer dielectric film 38. The wiring layer 51 may be provided on the upper surface of the semiconductor substrate 10 via the dielectric film 44. The wiring layer 51 is formed of polysilicon as an example. For example, the gate pad 50 is connected to the gate electrode 24 of a gate trench or the like in the IGBT. The details of the cross section A-A will be described below. The emitter electrode 52 may be connected to the source region 22 of the first conductivity type in a MOS transistor. In FIG. 1, the dielectric film and the contact hole are omitted.

In FIG. 1, the emitter electrode 52 may be an electrode having a largest area in the top plan view among electrodes provided on the upper surface of the semiconductor substrate 10. The gate pad 50 may be arranged between the emitter electrode 52 and the edge side 102-1 in the top plan view. The gate pad 50 may be sandwiched by the emitter electrode 52 in the Y axis direction.

A lead frame or wiring such as a wire (not shown) is connected to an upper surface of the emitter electrode 52. In addition, a wire wiring portion 202 is connected to an upper surface of the gate pad 50. The wire wiring portion 202 may have a connection portion 204 in contact with the upper surface of the gate pad 50. The connection portion 204 may be a fixing material such as solder, or may be a part of wire wiring. The wire wiring may be ultrasonically bonded to, or may be crimped to the upper surface of the emitter electrode 52 at the connection portion 204.

The semiconductor substrate 10 is provided with an active portion 120. The active portion 120 is a region where a main current flows in the depth direction between the upper surface and the lower surface of the semiconductor substrate 10 when the semiconductor device 100 is controlled to be in an ON state. The active portion 120 is a region in which a transistor such as the IGBT, or a diode such as a FWD (a freewheeling diode) is provided inside the semiconductor substrate 10. The region covered by the emitter electrode 52 may be set as the active portion 120. In this case, the region sandwiched by the emitter electrode 52 in the top plan view may also be set as the active portion 120. In addition, when a guard ring or a field plate is provided in an annular shape along an outer periphery of the semiconductor substrate 10, a region surrounded by the guard ring or the field plate may be set as the active portion 120. The guard ring is a region of the P type provided from the upper surface of the semiconductor substrate 10 to a predetermined depth position. In addition, the field plate is a conductive member provided above the upper surface of the semiconductor substrate 10. The dielectric film is provided between the field plate and the semiconductor substrate 10. The guard ring and the field plate may be provided to pass between the gate pad 50 and the edge side 102-1 that are described below.

As described above, the emitter electrode 52 is electrically connected to the active portion 120 via the contact hole (the through hole 210). As described above, the gate pad 50 may be connected to a gate runner (the wiring layer 51) formed of polysilicon, aluminum, or the like, via the contact hole. The gate voltage applied to the gate pad 50 is supplied to the gate electrode 24 of each transistor portion in the active portion 120 by the gate runner or the like.

The semiconductor device 100 may include a diode element 178. The diode element 178 of the present example is a PN junction diode arranged above the semiconductor substrate 10. The diode element 178 may function as a temperature detection portion. The diode element 178 may be arranged substantially in the center of the semiconductor substrate 10 in the top plan view. For example, the diode element 178 may cover the central position of the semiconductor substrate 10. The diode element 178 may be sandwiched by the emitter electrode 52 in the top plan view. The emitter electrode 52 of the present example is divided into at least two regions, and the diode element 178 is sandwiched between the two regions of the emitter electrode 52.

The semiconductor device 100 may have an anode pad 174 and a cathode pad 176. The anode pad 174 is electrically connected to an anode of the diode element 178, and the cathode pad 176 is electrically connected to a cathode of the diode element 178. The anode pad 174 and the cathode pad 176 may be connected to the diode element 178 by wiring formed of polysilicon, aluminum or the like.

As an example, the gate pad 50 is arranged on an edge side 102-1 side, and the anode pad 174 and the cathode pad 176 are arranged on an edge side 102-2 side. The edge side 102-1 side refers to the edge side 102-1 side further than the center of the semiconductor substrate 10 in the X axis direction, and the edge side 102-2 side refers to the edge side 102-2 side further than the center of the semiconductor substrate 10. As described above, the gate pad 50 may be arranged between the emitter electrode 52 and the edge side 102-1. The anode pad 174 and the cathode pad 176 may be arranged between the emitter electrode 52 and the edge side 102-2. Similarly to the gate pad 50, the wire wiring portion 202 may be connected to upper surfaces of the anode pad 174 and the cathode pad 176.

The semiconductor device 100 may further have a current sensing pad 172. Below the current sensing pad 172, the semiconductor substrate 10 may be provided with a current sensing region 110. The current sensing region 110 may include a transistor portion that is electrically provided in parallel with the transistor portion in the active portion 120 and that has a similar structure. In the top plan view, the current sensing region 110 is smaller than the active portion 120. A current flowing through the active portion 120 can be estimated from a current flowing through the current sensing region 110. The current sensing pad 172 may be arranged between the emitter electrode 52 and the edge side 102-2. Similarly to the gate pad 50, the wire wiring portion 202 may be connected to an upper surface of the current sensing pad 172.

The gate pad 50, the anode pad 174, the cathode pad 176, and the current sensing pad 172 shown in FIG. 1 are examples of a pad portion. However, the pad portion is not limited to the pads described above. The pad portion is arranged above the upper surface of the semiconductor substrate 10, is formed of metal such as aluminum, and is separated from the emitter electrode 52. In FIG. 2A and subsequent figures, a structure in a vicinity of the gate pad 50 will be mainly described; however, a vicinity of each pad portion may have a structure similar to the vicinity of the gate pad 50.

As described above, FIG. 2A is a figure showing an example of the cross section A-A in FIG. 1. The cross section A-A is an XZ plane passing through the gate pad 50 and the connection portion 204. In the cross section, the semiconductor device 100 of the present example has the semiconductor substrate 10, the dielectric film 44, the wiring layer 51, the interlayer dielectric film 38, the barrier metal layer 220, the tungsten portion 230, the gate pad 50, the connection portion 204, and the wire wiring portion 202. In addition, a region of a part of the upper surface of the gate pad 50 may be covered with a protective member 240 such as polyimide. In the upper surface of the gate pad 50, a region exposed without being covered by the protective member 240 is referred to as an opening region 201.

The connection portion 204 is connected to the upper surface of the gate pad 50 in the opening region 201. On the upper surface of the gate pad 50, a portion in contact with the connection portion 204 is referred to as a connection region 206. It should be noted that an upper surface of the semiconductor device 100 is sealed with a sealing resin such as silicone gel. This makes it possible to electrically insulate the upper surface of the semiconductor device 100 from an outside, and also makes it possible to protect the semiconductor device 100 from a foreign substance such as moisture.

The semiconductor substrate 10 may have the drift region 20 of the first conductivity type and a well region 11 of a second conductivity type. In the present specification, the first conductivity type is N type and the second conductivity type is the P type; however, the conductivity type may be reversed. The drift region 20 may also be provided in the entire active portion 120 shown in FIG. 1. The well region 11 is provided below the gate pad 50 and between the drift region 20 and the upper surface 21 of the semiconductor substrate 10.

The wiring layer 51 is provided between the semiconductor substrate 10 and the gate pad 50. The wiring layer 51 is formed of a conductive material such as polysilicon doped with an impurity. The wiring layer 51 of the present example also functions as the gate runner described above. The wiring layer 51 includes a region that overlaps at least a part of the connection region 206 in the top plan view. The wiring layer 51 may include a region that overlaps the entire connection region 206, may include a region that overlaps the entire opening region 201, or may include a region that overlaps the entire gate pad 50.

The dielectric film 44 is provided between the wiring layer 51 and the upper surface 21 of the semiconductor substrate 10. The dielectric film 44 is, for example, a film obtained by oxidizing or nitriding the upper surface 21 of the semiconductor substrate 10, but is not limited to this. The dielectric film 44 may be formed of the same material as a gate dielectric film that insulates the gate electrode and the semiconductor substrate 10 in the active portion 120.

The interlayer dielectric film 38 is a dielectric layer provided between the wiring layer 51 and the gate pad 50. The interlayer dielectric film 38 is, as an example, boron-doped silicate glass (BPSG: Boron Phosphorus Silicate Glass or BSG: Boron Silicate Glass). The interlayer dielectric film 38 may be a stacked body in which the boron-doped silicate glass is stacked on an NSG film. The NSG film is a film that is constituted by NSG (Non-doped Silicate Glass) and that is not doped with boron and phosphorus. A film thickness of the interlayer dielectric film 38 is, for example, approximately 1 µm, but is not limited to this. The interlayer dielectric film 38 is provided with the through hole 210. The through hole 210 passes through from an upper surface 221 of the interlayer dielectric film 38 to a lower surface. By filling the through hole 210 with the conductive material, the gate pad 50 and the wiring layer 51 are electrically connected. The interlayer dielectric film 38 has the through hole 210 at least below the connection region 206. The expression of below the connection region 206 means a region that is arranged on a lower side further than the connection region 206 and that overlaps the connection region 206 in the top plan view. The interlayer dielectric film 38 of the present example may also have the through hole 210 in a region that does not overlap the connection region 206.

The tungsten portion 230 is formed of a material containing tungsten and is provided inside the through hole 210. The tungsten portion 230 may be formed of tungsten, or may be formed of an alloy containing tungsten. An upper end of the tungsten portion 230 is in contact with the gate pad 50. A lower end of the tungsten portion 230 may be in contact with the wiring layer 51, and may be connected to the wiring layer 51 via another conductive member. The tungsten portion 230 may be in contact with the interlayer dielectric film 38 or may be in contact with another conductive member inside the through hole 210.

The barrier metal layer 220 covers the upper surface 221 of the interlayer dielectric film 38 at least below the connection region 206. The barrier metal layer 220 is formed of a material containing titanium. The barrier metal layer 220 may be stacked with different materials. As an example, the barrier metal layer 220 is a stacked body in which a titanium nitride layer is stacked on a titanium layer. By the barrier metal layer 220 being the stacked body in which the titanium nitride layer is stacked on the titanium layer, the titanium layer and the wiring layer 51 formed of polysilicon can react to form titanium silicide, and contact resistance of wiring layer 51 and the barrier metal layer 220 can be reduced. In addition, by forming the titanium silicide, the titanium layer becomes thin, for example, approximately several nm or less such that hydrogen can pass through the barrier metal layer 220 and reach a layer of a lower side, and thus a damage formed inside the semiconductor device 100 in a manufacturing process can be recovered by annealing in a hydrogen atmosphere. Here, the damage is, for example, a dangling bond or the like existing at an interface between the dielectric film 44 and the semiconductor substrate 10. For example, in a case where the titanium layer is as thick as approximately 20 nm or more, even when the annealing is performed in the hydrogen atmosphere, the hydrogen is adsorbed on the titanium layer, and thus the hydrogen cannot reach the layer of the lower side of the titanium layer. Therefore, the damage formed inside the semiconductor device 100 is not recovered by the annealing in the hydrogen atmosphere. A thickness of the barrier metal layer 220, which includes the titanium layer and the titanium nitride layer on the upper surface 221 of the interlayer dielectric film 38, may be approximately 50 nm or more and 200 nm or less.

The barrier metal layer 220 may also be provided in a region that does not overlap the connection region 206 in the top plan view. The barrier metal layer 220 may also be provided below the protective member 240. In addition, the barrier metal layer 220 may also be provided inside the through hole 210. The barrier metal layer 220 may cover a side wall and a bottom surface of the through hole 210. In this case, the barrier metal layer 220 is arranged between the tungsten portion 230, and the wiring layer 51 and the interlayer dielectric film 38.

When a part of the emitter electrode 52 or an electrode of the gate pad 50 or the like is defective, a resin ion included in the sealing resin reaches, by an electric field inside the semiconductor device 100, the wiring layer 51 or the dielectric film 44 from an upper surface side of the semiconductor device 100. In particular, in the active portion 120, the resin ion is trapped in the dielectric film 44, and a tunnel current flows more than usual, and thus an adverse effect such as a decrease in threshold voltage is caused to a characteristic of the semiconductor device 100.

In contrast with this, by providing the barrier metal layer 220, it is possible to suppress reaching of the resin ion to a layer of a lower side further than the barrier metal layer 220. The barrier metal layer 220 may be provided not only in the active portion 120 but also below the pad portion. It is preferable to provide the barrier metal layer 220 on the entire surface below the pad portion. The entire surface below the pad portion is an entire region that is below the pad portion and that overlaps the pad portion in the top plan view. Thereby, it is possible to suppress the reaching of the resin ion to the wiring layer 51 or the dielectric film 44 when a part of the electrode of the pad portion is defective, and it is possible to suppress an invasion of the resin ion into the active portion 120 adjacent to the pad portion, and thus the decrease in threshold voltage or the like does not occur.

However, the barrier metal layer 220 containing titanium has comparatively low adhesion to the interlayer dielectric film 38. For example, a reaction of titanium in the barrier metal layer 220 and a material such as boron in the interlayer dielectric film 38 reduces the adhesion.

When the adhesion between the barrier metal layer 220 and the interlayer dielectric film 38 is reduced, in a case where the wire wiring portion 202 is pulled, the barrier metal layer 220 and the interlayer dielectric film 38 are easily peeled off from each other. A reason why the barrier metal layer 220 and the interlayer dielectric film 38 are easily peeled off from each other is that in the case where the wire wiring portion 202 is pulled, stress is applied in a vertical direction between the barrier metal layer 220 and the interlayer dielectric film 38, in particular, below the connection region 206. In a case where the adhesion of an interface (referred to as an XY interface) parallel to an XY plane between the barrier metal layer 220 and the interlayer dielectric film 38 is reduced, and a structure is not formed at the XY interface, the barrier metal layer 220 and the interlayer dielectric film 38 are easily peeled off from each other in the vertical direction. The case where the structure is not formed at the interface is, for example, a case where the through hole or the like described below is not formed. In the case where the wire wiring portion 202 is pulled, when the barrier metal layer 220 and the interlayer dielectric film 38 are peeled off from each other, the gate pad 50 on the barrier metal layer 220 is also removed together with the wire wiring portion 202.

In the present example, the through hole 210 and the tungsten portion 230 are provided below the connection region 206. Therefore, it is possible to reduce an area of the XY interface between the interlayer dielectric film 38 and the barrier metal layer 220 below the connection region 206. Accordingly, it is possible to suppress the peeling of the barrier metal layer 220 and the interlayer dielectric film 38. It should be noted that adhesion between the tungsten portion 230 and the barrier metal layer 220 is better than the adhesion between the interlayer dielectric film 38 and the barrier metal layer 220.

Figure 3:
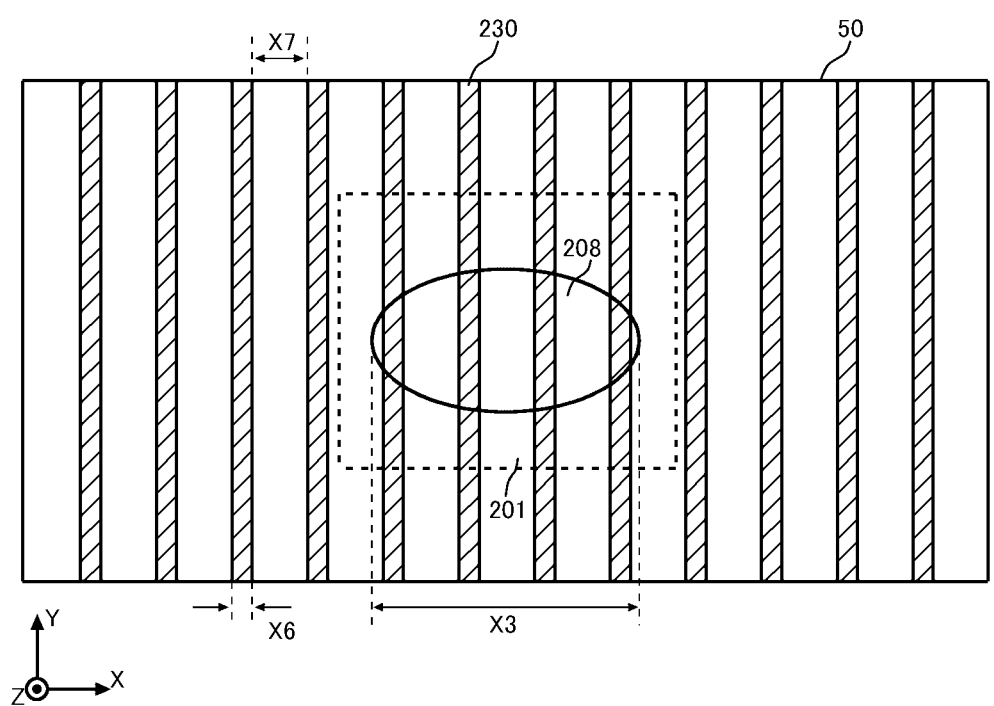
FIG. 3 is a figure showing an arrangement example of a tungsten portion 230 in the top plan view.

FIG. 3 is a figure showing an arrangement example of a tungsten portion 230 in the top plan view. In FIG. 3, a region overlapping the connection region 206 shown in FIG. 2A is referred to as a region below connection 208. A size and a shape of the region below connection 208 in the top plan view are the same as the connection region 206. In addition, in FIG. 3, the opening region 201 is shown by a dashed line. An inside of a dashed line rectangle is the opening region 201. The protective member 240 is provided on an outside of the dashed line rectangle, but is omitted in FIG. 3.

In FIG. 3, each tungsten portion 230 extends in the Y axis direction. A length of each tungsten portion 230 in the Y axis direction is larger than a length in the X axis direction. A shape of the tungsten portion 230 in the top plan view may be a stripe shape. By forming the shape of the tungsten portion 230 in the top plan view to be the stripe shape, it is easy to increase an area of the tungsten portion 230 in comparison with a case of a circular shape in the top plan view. The tungsten portion 230 of the present example may be provided from one end portion to the other end portion of the gate pad 50 in the Y axis direction. In another example, the tungsten portion 230 may be provided in a region of an inner side further than the end portion of the gate pad 50. In addition, the tungsten portion 230 may extend beyond the end portion of the gate pad 50 in the Y axis direction. The tungsten portion 230 may extend in the X direction. The tungsten portion 230 extending in the X axis direction and the tungsten portion 230 extending in the Y axis direction may intersect in a grid pattern.

In FIG. 2A, a width X1 of each through hole 210 in the X axis direction may be 0.5 µm or more and 0.8 µm or less. Each width X1 may be substantially the same. The width X1 may be measured at an upper end of the through hole 210. By setting the width X1 to 0.5 µm or more, when the barrier metal layer 220 is formed on the interlayer dielectric film 38, it is also possible to form the barrier metal layer 220 having a predetermined thickness at a bottom portion of the through hole 210. In addition, by setting the width X1 to 0.8 µm or less, the tungsten can sufficiently remain inside the through hole 210 at a time of etch back. An outline of the etch back process will be described below. The width of the upper end of the through hole 210 may be larger than the width of a lower end of the through hole 210. By the width of the upper end of the through hole 210 being larger than the width of the lower end of the through hole 210, and the side wall of the through hole 210 being tapered, it is possible to increase the thickness of the barrier metal layer 220 on the side wall of the through hole 210. The state in which the side wall of the through hole 210 is tapered is a state in which the width of the through hole 210 is continuously narrowed from the upper end to the lower end. For example, the width X1 of the upper end of the through hole 210 may be 0.5 µm, and the width of the lower end of the through hole 210 may be 0.3 µm.

In the present example, a plurality of through holes 210, in which a plurality of tungsten portions 230 are formed, are arranged at predetermined intervals along the X axis direction. A distance X2 between the two adjacent through holes 210 may be, for example, 0.5 µm or more and 3.2 µm or less. The distance X2 may be measured at the upper end of the through hole 210. Each distance X2 may be substantially the same. The distance X2 may be greater than or equal to the width X1. By the through hole 210 having the above-described sizes for the width X1 and the distance X2, it is possible to suppress a variation in the manufacturing process and to easily form the tungsten portion 230. In addition, by setting the distance X2, which is the width at which the interlayer dielectric film 38 and the barrier metal layer 220 are in contact with each other at the XY interface, to 3.2 µm or less, there is an effect of suppressing the peeling of the interlayer dielectric film 38 and the barrier metal layer 220.

Here, a method for forming the tungsten portion 230 may be as follows. First, the through hole 210 is formed in the interlayer dielectric film 38 by photolithography and dry etching. Next, the barrier metal layer 220 is formed inside the through hole 210 and on the interlayer dielectric film 38. Next, a film of the tungsten is formed inside the through hole 210 and on the interlayer dielectric film 38, and the tungsten fills the inside of the through hole 210. Next, the tungsten portion 230 is formed by performing the etch back. Here, the etch back is processing of causing the tungsten inside the through hole 210 to remain and removing the tungsten film on the interlayer dielectric film 38 by etching. The above description is an example of a method for forming the tungsten portion 230. It should be noted that the tungsten portion 230 of the gate pad 50 may be formed at the same time as a formation of the tungsten portion 230 of an active region shown in FIG. 16 described below.

In FIG. 3, a width of the region below connection 208 in the X axis direction is set as X3. A width X6 of each tungsten portion 230 in the X axis direction is smaller than the width X3. The width X6 may be half or less of the width X3, or may be ⅓ or less. A distance X7 between the adjacent tungsten portions in the X axis direction 230 is smaller than the width X3. The distance X7 may be half or less of the width X3, or may be ⅓ or less. As shown in FIG. 2A and FIG. 3, the region below connection 208 may include the plurality of tungsten portions 230 arrayed in the X axis direction.

In the region below connection 208, an area of a region where the through hole 210 is formed in the top plan view is set as S1, and a total area of the region below connection 208 is set as S. It is preferable for the area S1 of the through hole 210 to be 20% or more of the area S of the region below connection 208. That is, in the region below connection 208, an area of an XY interface between the barrier metal layer 220 and the gate pad 50 is affected by the thickness of the barrier metal layer 220 on the side wall of the through hole 210, and may be approximately 0% or more and approximately 80% or less of the area S of the region below connection 208. By providing the through hole 210, the area of the XY interface between the interlayer dielectric film 38 and the barrier metal layer 220, which have weak adhesion, is reduced such that the interlayer dielectric film 38 and the barrier metal layer 220 are not peeled off from each other, and thus it is possible to prevent an occurrence of a defect in which the gate pad 50 is removed due to the peeling.

Figure 4:
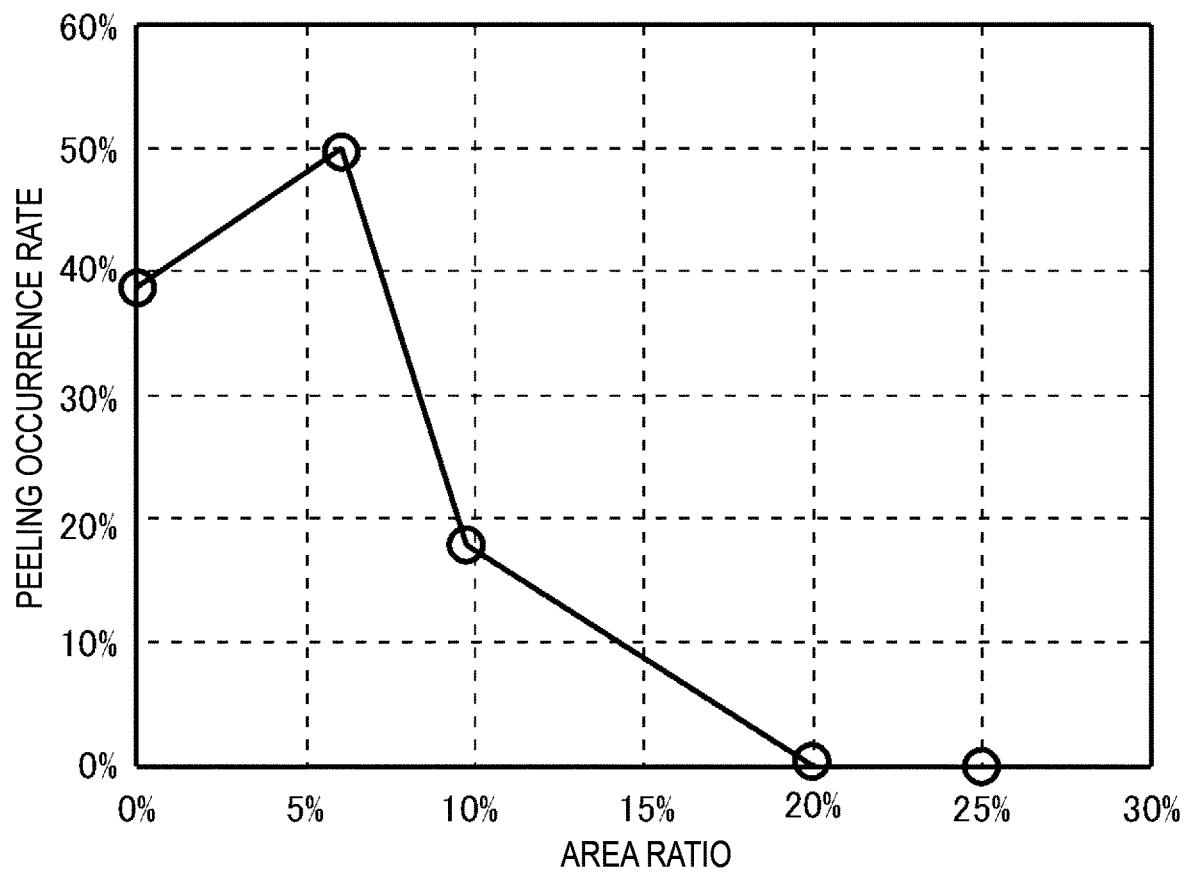
FIG. 4 is a figure showing an example of results of tensile tests on a plurality of semiconductor devices 100.

FIG. 4 is a figure showing an example of results of tensile tests on a plurality of semiconductor devices 100. In the tensile test, the wire wiring portion 202 is pulled upward to test whether the gate pad 50 is peeled off from the interlayer dielectric film 38. In the tensile test, a product in which the wire wiring portion 202 or the connection portion 204 is broken before the gate pad 50 is peeled off is determined to be non-defective. A rate at which the gate pad 50 is removed before the wire wiring portion 202 or the connection portion 204 is broken is set as a peeling occurrence rate. In FIG. 4, a vertical axis represents the peeling occurrence rate, and a horizontal axis represents an area ratio S1/S between the area of the region where the through hole 210 is formed in the region below connection 208, and the region below connection 208, in percentage. A wire used in the tensile test was 400 µm in diameter or 500 µm in diameter. In the tensile test, a test in which a wire of another diameter was used was also performed, but no significant dependence on a wire diameter was observed. The wire may be formed of aluminum, or may be formed of a compound having aluminum as a main component. For example, silicon may be added to the wire.

As shown in FIG. 4, when the area ratio S1/S was 20% or more, the peeling occurrence rate became 0%. Therefore, the area ratio S1/S is preferably 20% or more. By setting the area ratio S1/S to 20% or more, the occurrence of the defect, in which the gate pad 50 is removed, has been eliminated. The area ratio may be 50% or more, or may be 100%.

In addition, an area of the opening region 201 in the top plan view is set as $S_{201}$. In a region below the opening region 201, the area of the tungsten portion 230 in the top plan view is set as S1'. An area ratio $S1'/S_{201}$ may be 20% or more, may be 50% or more, or may be 100%. When the wire wiring portion 202 is bonded inside the opening region 201, the position of the region below connection 208 may vary, and thus it is effective to set the area ratio $S1'/S_{201}$ to 20% or more in suppressing the occurrence of the defect in which the gate pad 50 is removed. That is, even when the position of the region below connection 208 for the wire bonding varies, it is effective to always set the area ratio S1/S to be 20% or more in suppressing the defect in which the gate pad 50 is removed.

In addition, an area of the gate pad 50 in the top plan view is set as $S_{50}$. In addition, in a region below the gate pad 50, the area of the tungsten portion 230 in the top plan view is set as S1". An area ratio $S1''/S_{50}$ may be 0.3% or more, may be 20% or more, may be 50% or more, or may be 100%. That is, it is important for the area ratio S1/S to be 20% or more in suppressing the occurrence of the defect in which the gate pad 50 is removed, and the area of the tungsten portion other than the region below connection 208, for example, other than the opening region 201 may be small. It is effective to set the area ratio S1/S to be 20% or more in suppressing the defect in which the gate pad 50 is removed, and thus in FIG. 2A, the width X1 and the distance X2 of the through hole 210 may satisfy the relational expression of X1/(X1+X2)≥0.2 such that the area ratio S1/S is 20% or more.

Figure 5:
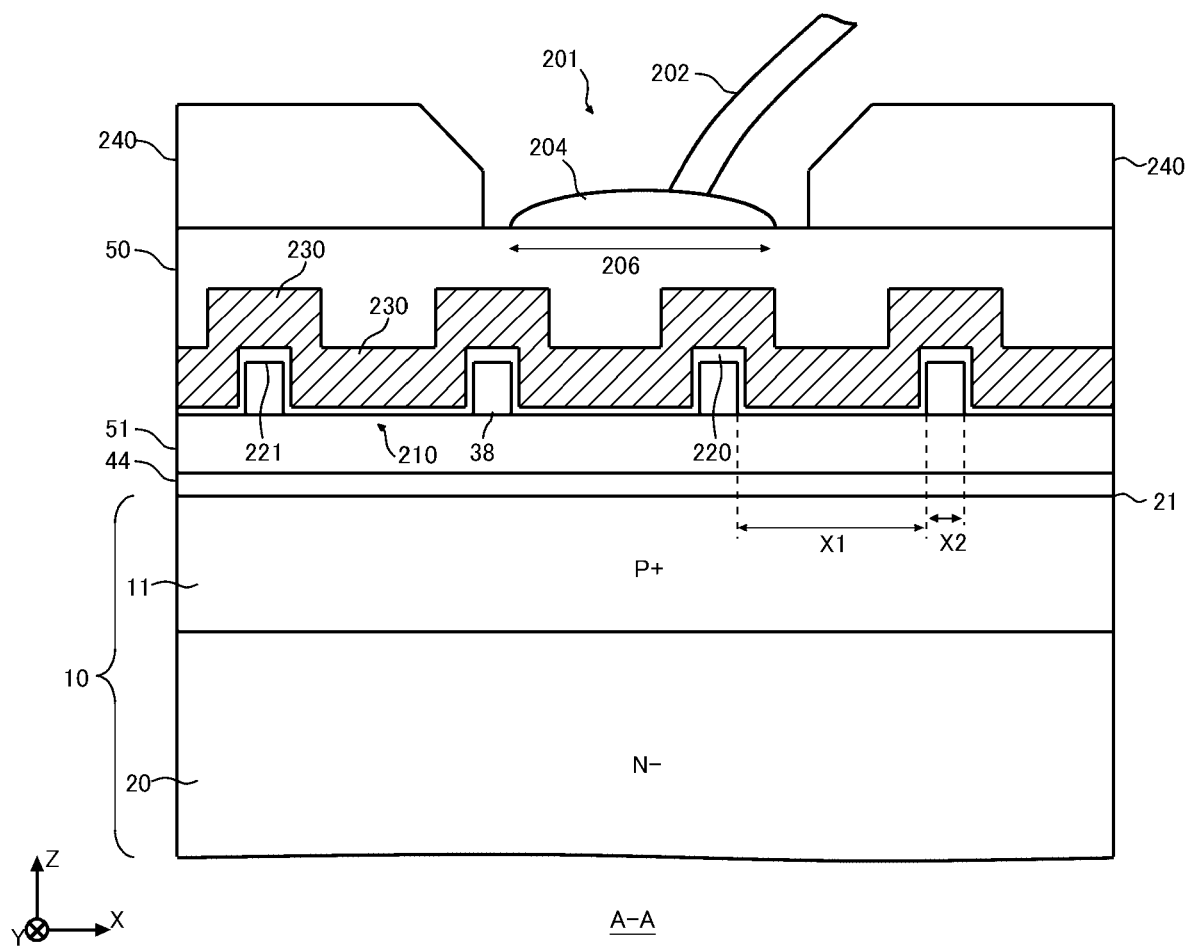
FIG. 5 is a figure showing another example of the A-A cross section.

FIG. 5 is a figure showing another example of the A-A cross section. The present example is a cross sectional structure when the width X1 of the through hole 210 in the X axis direction is larger than 0.8 µm. The through hole 210 may have a stripe shape extending in the Y axis direction, similarly to the example described above. In a case where in the region below connection 208, the area of the region where the through hole 210 is formed in the top plan view is set as S1, and the total area of the region below connection 208 is set as S, the area ratio S1/S may be larger than 50%. In the semiconductor device 100 of the present example, structures of the tungsten portion 230, the through hole 210, the barrier metal layer 220, and the interlayer dielectric film 38 are different from those in the example of FIG. 2A. Other structures are similar to those in the example in FIG. 2A.

Figure 6:
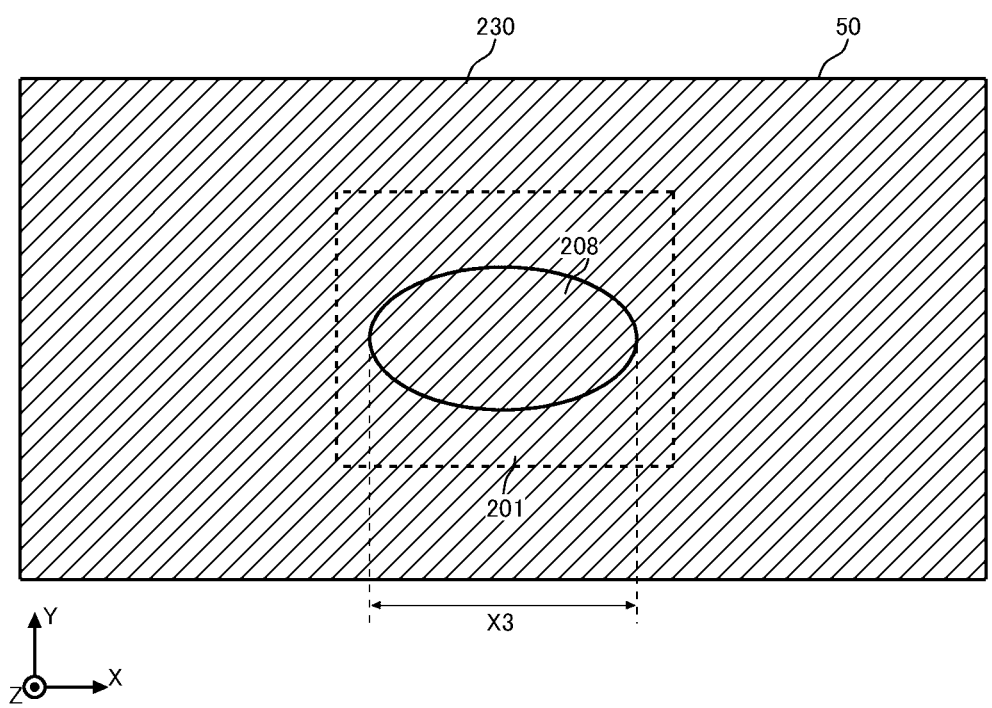
FIG. 6 is a figure showing an arrangement example of the tungsten portion 230, in the top plan view, in the semiconductor device 100 shown in FIG. 5.

FIG. 6 is a figure showing an arrangement example of the tungsten portion 230, in the top plan view, in the semiconductor device 100 shown in FIG. 5. In the examples of FIG. 5 and FIG. 6, the tungsten portion 230 is provided entirely in the region below connection 208 in the top plan view. A width of the tungsten portion 230 in the X axis direction is larger than the width X3 of the region below connection 208. The end portion of the tungsten portion 230 of the present example is arranged below the gate pad 50 and on the barrier metal layer 220 in a region other than the region below connection 208. The expression of below the gate pad 50 means a region which is arranged on a lower side further than the gate pad 50 and overlaps the gate pad 50 in the top plan view. The barrier metal layer 220 is provided between the tungsten portion 230 and the upper surface 221 of the interlayer dielectric film 38. The tungsten portion 230 may cover the entire region below the opening region 201 in the top plan view, or may cover the entire region below the gate pad 50. In the present example as well, by the through hole 210 being provided in the interlayer dielectric film 38 in the region below connection 208, an XY interface between the upper surface 221 of the interlayer dielectric film 38 and the barrier metal layer 220 is smaller in comparison with a case where the through hole 210 is not provided. This makes it possible to suppress the peeling of the interlayer dielectric film 38 and the barrier metal layer 220, and prevent the defect in which the gate pad 50 is removed.

The width X1 of the through hole 210 in the present example is larger than 0.8 µm, and thus the tungsten cannot sufficiently remain in the through hole 210 when the etch back of the tungsten is performed in the above-described method for forming the tungsten portion 230. This is because the tungsten inside the through hole 210 is also etched at the time of the etch back of the tungsten. In addition, at the time of the etch back, the tungsten that could have not been removed remains inside the through hole 210, which may cause a problem in a subsequent step. For example, the problem in the subsequent steps includes the tungsten, which remains in the through hole 210 by the etch back, being peeled off from the barrier metal layer 220 to be a foreign substance, or the like. Therefore, when the width X1 is larger than 0.8 µm, it is preferable not to perform the etch back of the tungsten. In the region below the gate pad 50, the structures shown in FIG. 5 and FIG. 6 can be formed by not etching back the tungsten after a deposition. In addition, in a region where the gate runner surrounding the active portion 120 is formed, the tungsten on the interlayer dielectric film 38 may be etched together with the gate pad 50 and the barrier metal layer 220. This prevents the gate pad 50 and the emitter electrode 52 from being electrically connected. In FIG. 5 and FIG. 6, in the present example, the width X1 may be larger than the distance X2 between the two adjacent through holes 210. The width X1 may be twice or more, or may be three times or more of the distance X2. In addition, the width X1 may be larger than a width of the interlayer dielectric film 38 in the X axis direction. In addition, the width X1 may be smaller, or may be larger than the width X3 of the region below connection 208. In the present example, below the connection portion 204, the plurality of through holes 210 arrayed in the X axis direction are provided. In another example, below the connection portion 204, only one through hole 210 may be included among the plurality of through holes 210 arrayed in the X axis direction.

Figure 7:
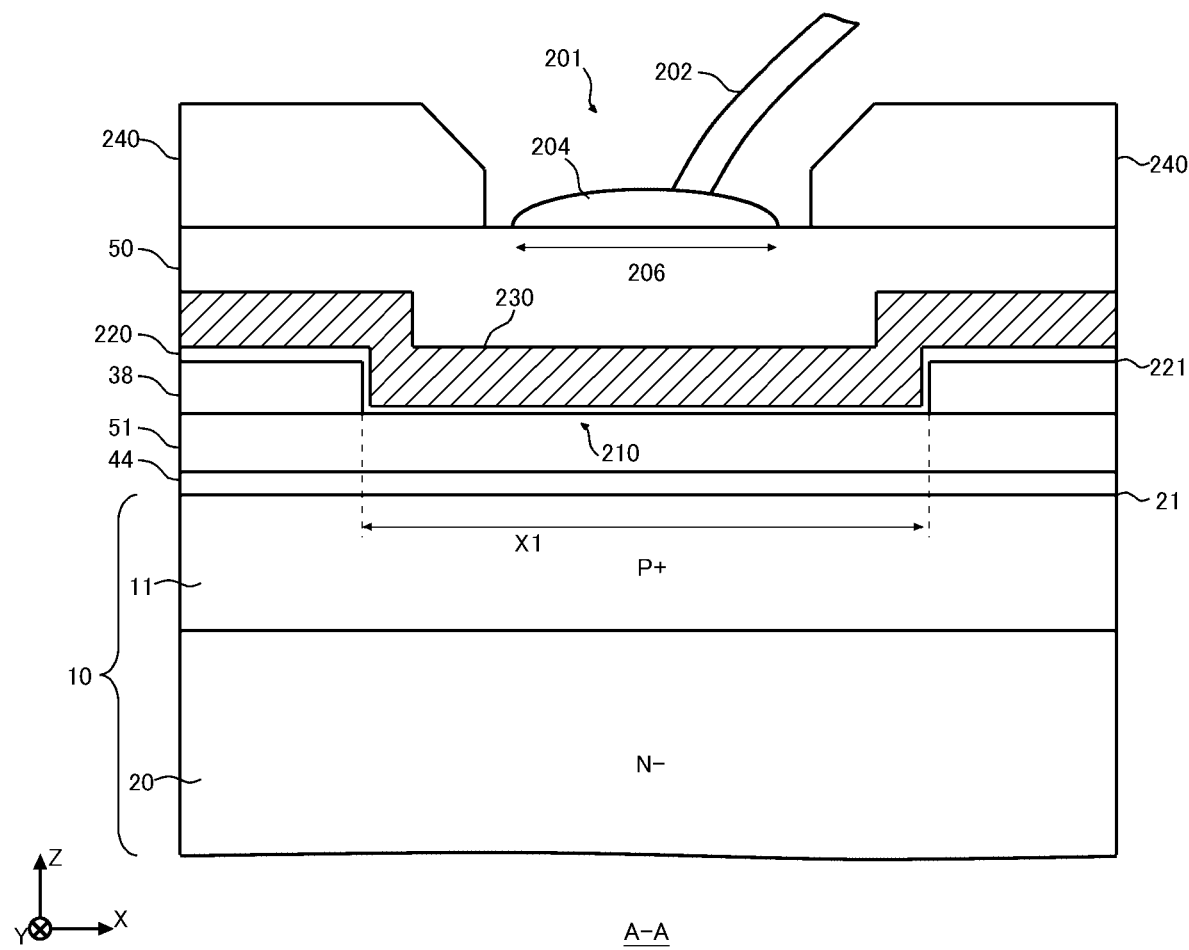
FIG. 7 is a figure showing another example of the A-A cross section.

FIG. 7 is a figure showing another example of the A-A cross section. In the present example, in a case where in the region below connection 208, the area of the region where the through hole 210 is formed in the top plan view is set as S1, and the total area of the region below connection 208 is set as S, the area ratio S1/S is 100%. In the semiconductor device 100 of the present example, structures of the tungsten portion 230, the through hole 210, the barrier metal layer 220, and the interlayer dielectric film 38 are different from those in the example of FIG. 2A. Other structures are similar to those in the example in FIG. 2A.

Figure 8:
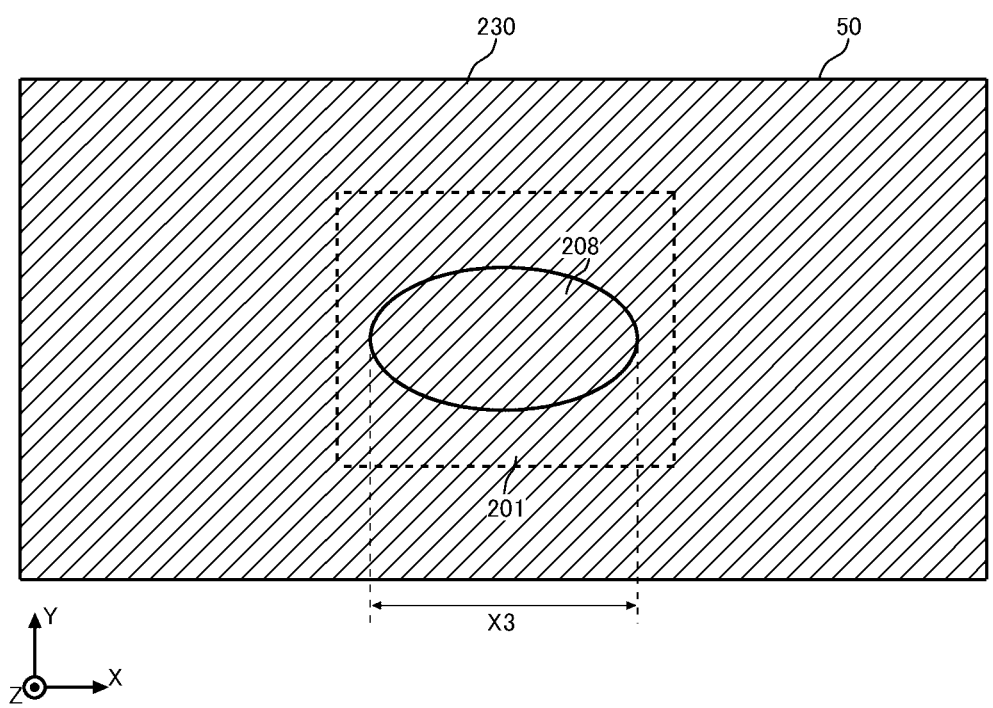
FIG. 8 is a figure showing an arrangement example of the tungsten portion 230, in the top plan view, in the semiconductor device 100 shown in FIG. 7.

FIG. 8 is a figure showing an arrangement example of the tungsten portion 230, in the top plan view, in the semiconductor device 100 shown in FIG. 7. In the examples of FIG. 7 and FIG. 8, the tungsten portion 230 and the through hole 210 are provided entirely in the region below connection 208 in the top plan view. The width of the tungsten portion 230 in the X axis direction is larger than the width X3 of the region below connection 208. The interlayer dielectric film 38 is not provided in the region below connection 208 of the present example Therefore, in the region below connection 208, the XY interface between the upper surface 221 of the interlayer dielectric film 38 and the barrier metal layer 220 does not exist, and by the XY interface between the upper surface 221 of the interlayer dielectric film 38 and the barrier metal layer 220 being peeled off, it is possible to suppress the removal of the gate pad 50.

In each example described in the present specification, the tungsten portion 230 may cover a part of the upper surface 221 of the interlayer dielectric film 38. In this case, the barrier metal layer 220 may be provided between the tungsten portion 230 and the upper surface 221 of the interlayer dielectric film 38. The tungsten portion 230 of the present example is arranged below the gate pad 50 and above the interlayer dielectric film 38 in a region other than the region below connection 208. The tungsten portion 230 may cover the entire region below the opening region 201 in the top plan view, or may cover the entire region below the gate pad 50.

In the region below the gate pad 50, the through hole 210 is provided in a part of a region including the region below connection 208. The through hole 210 may be provided in a region smaller than the opening region 201 in the top plan view, may be provided in the same region as the opening region 201, or may be provided in a region larger than the opening region 201. Below the gate pad 50, one through hole 210 may be provided in a region including the region below connection 208, and the through hole 210 may also be provided in a region other than the region below connection 208.

The tungsten portion 230 that is provided inside the through hole 210 and the tungsten portion 230 provided above the interlayer dielectric film 38 may be continuous. The through hole 210 is formed in the interlayer dielectric film 38, and after the barrier metal layer 220 is stacked, the tungsten is deposited inside the through hole 210 and above the interlayer dielectric film 38. In the region below the gate pad 50, it is possible to form the structure shown in FIG. 7 and FIG. 8 by not etching back the tungsten after the deposition. In addition, in the region where the gate runner surrounding the active portion 120 is formed, the tungsten on the interlayer dielectric film 38 may be etched together with the gate pad 50 and the barrier metal layer 220. This prevents the gate pad 50 and the emitter electrode 52 from being electrically connected.

Figure 9:
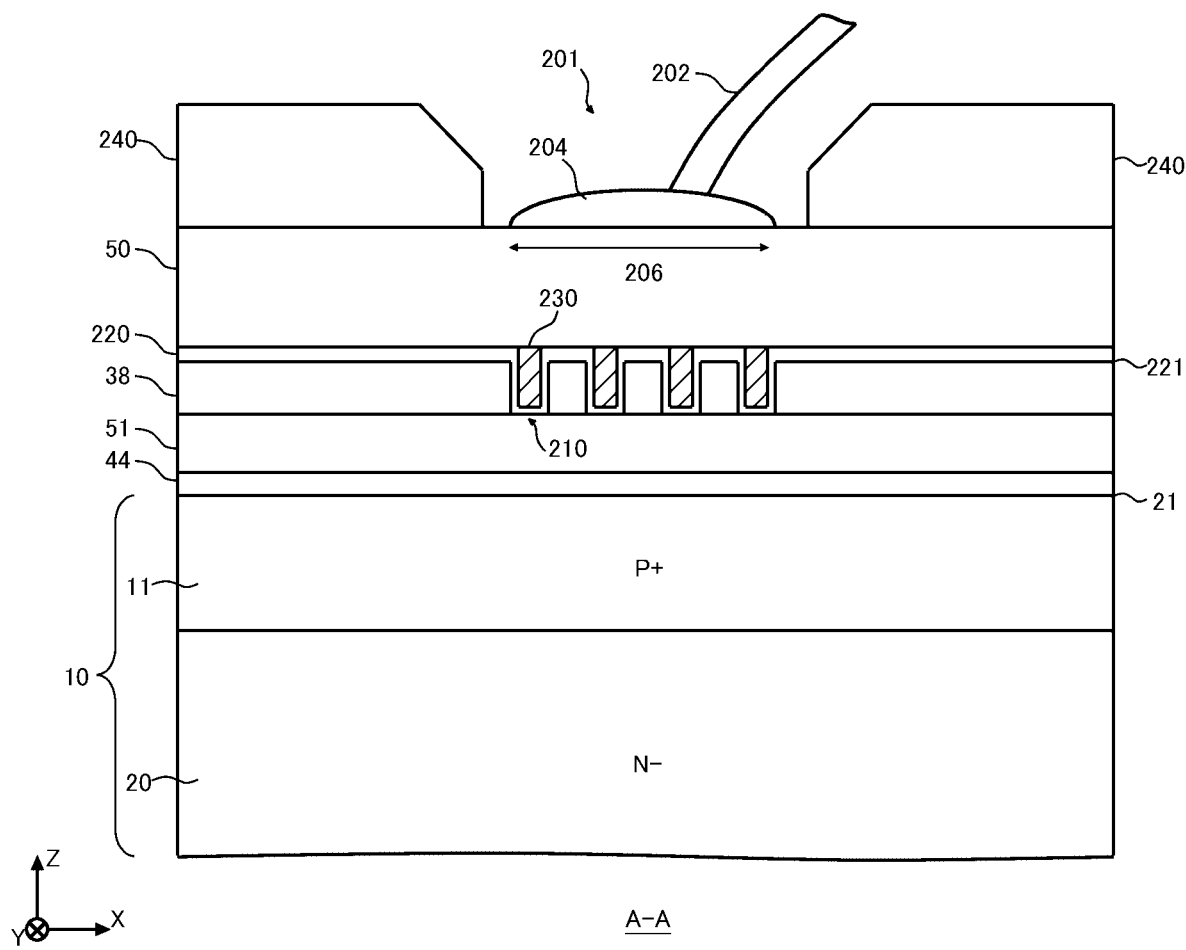
FIG. 9 is a figure showing another example of the A-A cross section.

FIG. 9 is a figure showing another example of the A-A cross section. In the cross section, the semiconductor device 100 of the present example is different from the examples in FIG. 1 to FIG. 8 in that the tungsten portion 230 and the through hole 210 are provided only below the connection region 206 or the opening region 201, and are not provided in other regions below the gate pad 50. The area of the gate pad 50 in the top plan view is set as S50. In addition, in a region below the gate pad 50, the area of the tungsten portion 230 in the top plan view is set as S1". The area ratio S1"/S50 may be 0.3% or more. Other structures are similar to any of the examples in FIG. 1 to FIG. 8. In the present example as well, in the region below connection 208 where the peeling easily occurs, it is possible to reduce the XY interface between the barrier metal layer 220 and the interlayer dielectric film 38, and by the XY interface between the upper surface 221 of the interlayer dielectric film 38 and the barrier metal layer 220 being peeled off, it is possible to suppress the removal of the gate pad 50.

Figure 10:
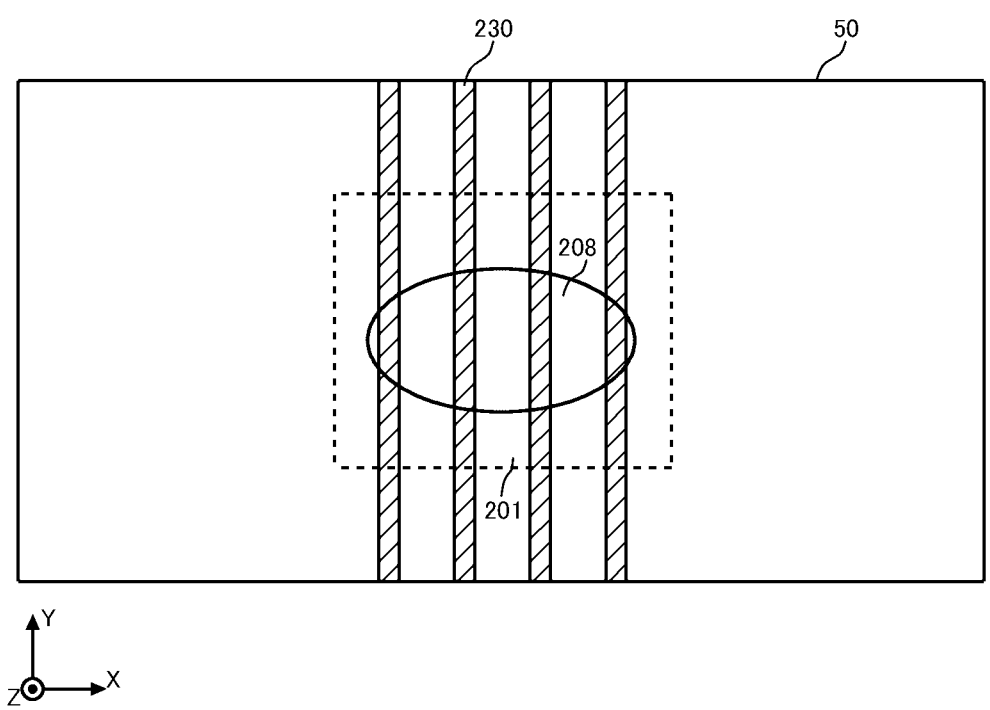
FIG. 10 is a figure showing an arrangement example of the tungsten portion 230, in the top plan view, in the semiconductor device 100 shown in FIG. 9.

FIG. 10 is a figure showing an arrangement example of the tungsten portion 230, in the top plan view, in the semiconductor device 100 shown in FIG. 9. As described above, each tungsten portion 230 is arranged to overlap the region below connection 208 or the opening region 201. However, as shown in FIG. 10, each tungsten portion 230 may extend to an outside of the region below connection 208 or the opening region 201 in the Y axis direction. The tungsten portion 230 may be extended to a position overlapping the end portion of the gate pad 50 in the Y axis direction. In another example, each tungsten portion 230 may be provided only in the region overlapping the region below connection 208 or the opening region 201, in the Y axis direction as well.

Figure 11:
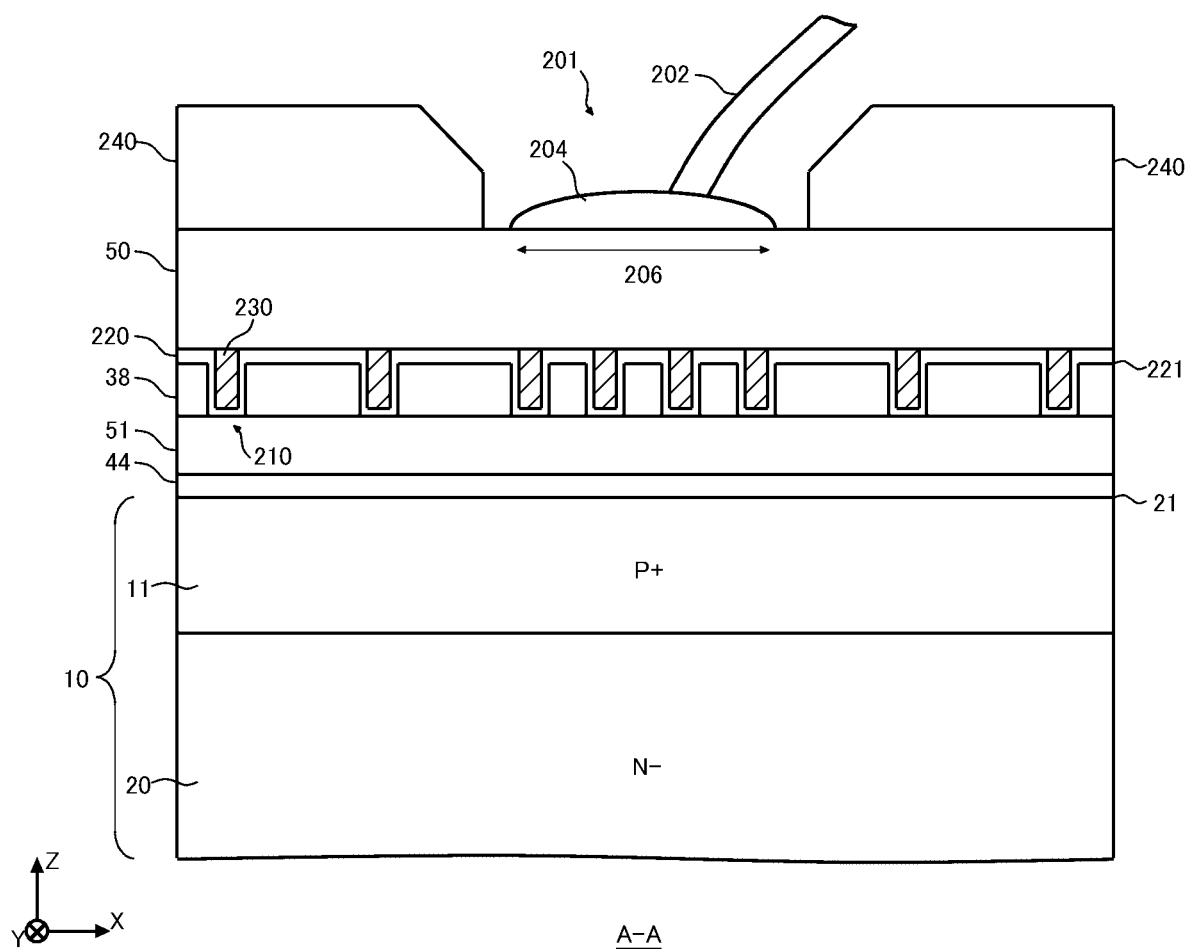
FIG. 11 is a figure showing another example of the A-A cross section.

FIG. 11 is a figure showing another example of the A-A cross section. In the present example, densities by which the tungsten portion 230 and the through hole 210 are provided are different between the region below the connection region 206 or the opening region 201, and another region. Other structures are similar to any of the examples in FIG. 1 to FIG. 10.

In the present example, the densities of the tungsten portion 230 and the through hole 210 in the region below the connection region 206 or the opening region 201 are higher than a density in the other region. That is, in the region below the connection region 206 or the opening region 201, the tungsten portion 230 and the through hole 210 of higher area ratios are provided.

In the present example, the widths of the through holes 210 and the tungsten portion 230 in the X axis direction are respectively equal. In the present example, cycles in which the tungsten portion 230 and the through hole 210 are arranged in the X axis direction in the region below the connection region 206 or the opening region 201 are shorter than a cycle in the other region. In the present example as well, in the region below connection 208 where the peeling easily occurs, it is possible to reduce the XY interface between the barrier metal layer 220 and the interlayer dielectric film 38, and by the XY interface between the upper surface 221 of the interlayer dielectric film 38 and the barrier metal layer 220 being peeled off, it is possible to suppress the removal of the gate pad 50.

Figure 12:
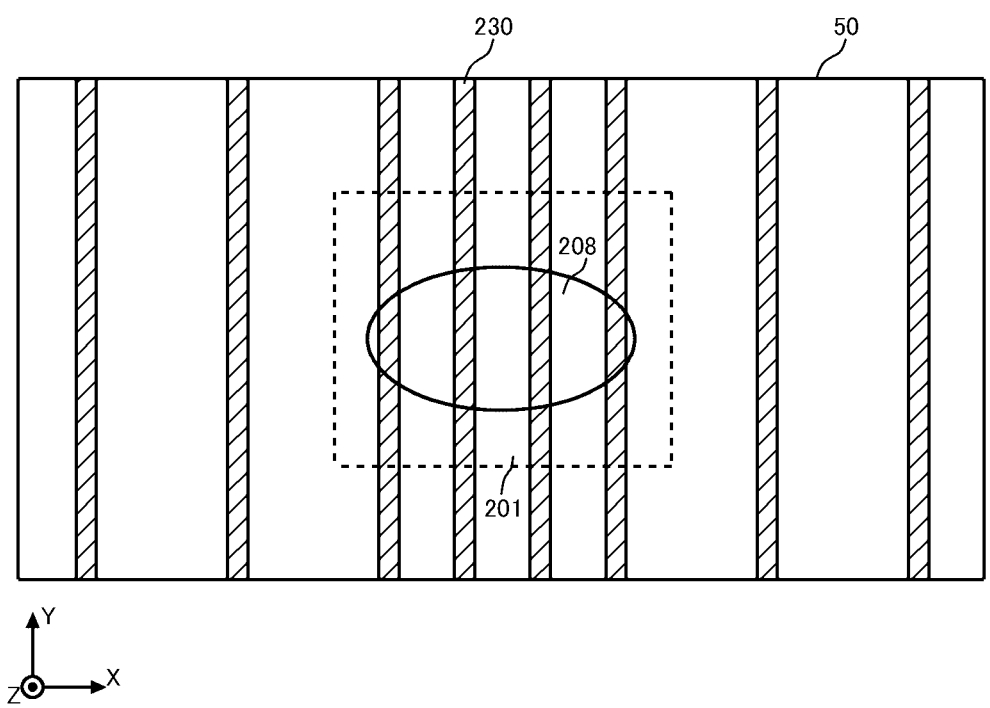
FIG. 12 is a figure showing an arrangement example of the tungsten portion 230, in the top plan view, in the semiconductor device 100 shown in FIG. 11.

FIG. 12 is a figure showing an arrangement example of the tungsten portion 230, in the top plan view, in the semiconductor device 100 shown in FIG. 11. As described above, the cycle in the X axis direction of the tungsten portion 230 overlapping the connection region 206 or the opening region 201 is shorter than that of the other region.

Figure 13:
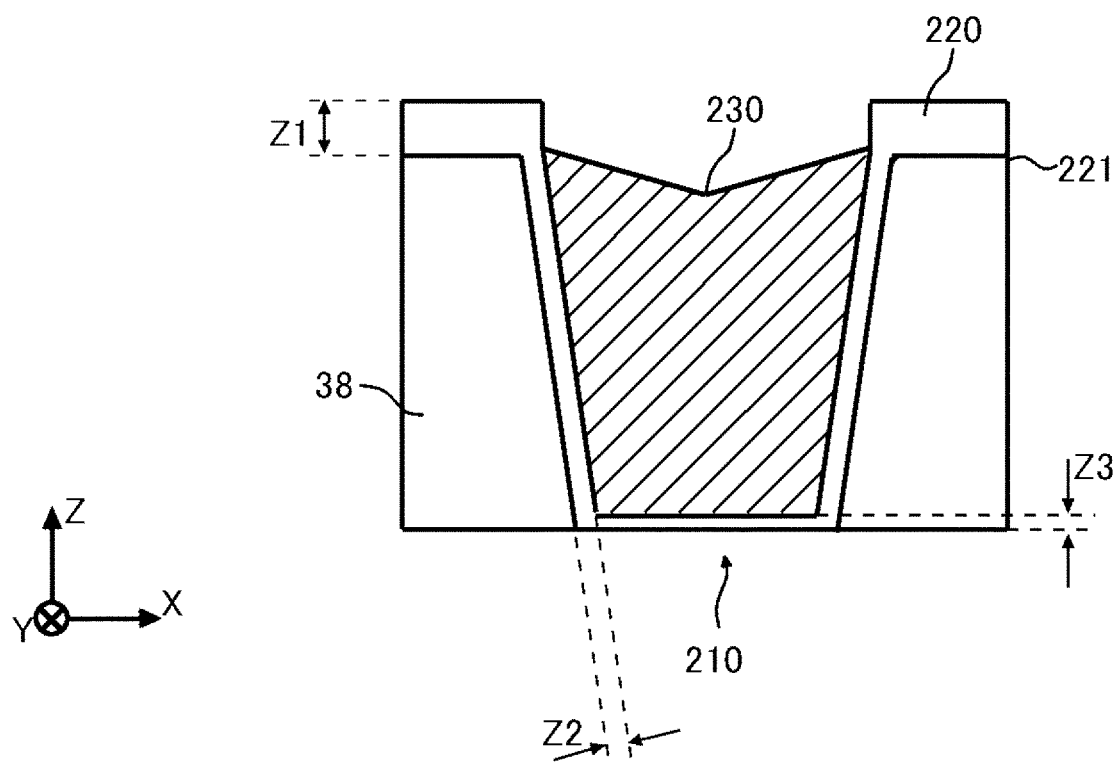
FIG. 13 is an enlarged cross sectional view of a vicinity of a through hole 210.

FIG. 13 is an enlarged cross sectional view of a vicinity of a through hole 210. A width of the lower end may be narrower in comparison with a width of the upper end of the through hole 210. The upper end of the tungsten portion filled in the through hole 210 may have a recess formed by the etch back. Assuming that a thickness of the barrier metal layer 220 provided on the upper surface 221 of the interlayer dielectric film 38 is set as Z1, a thickness of the barrier metal layer 220 provided on the side surface of the through hole 210 is set as Z2, and a thickness of the barrier metal layer 220 provided on the lower end of the through hole 210 is set as Z3, a relationship of Z1>Z2>Z3 is established. The thicknesses Z1 and Z3 are lengths in the Z axis direction. Z2 is a length in a direction perpendicular to the side wall of the through hole 210. The barrier metal layer 220 on the side surface of the through hole 210 and the barrier metal layer 220 on the bottom surface can prevent, even though the thickness is thin, the resin ion from reaching a region below the barrier metal layer 220 when the gate pad 50 is defective. This is because there is the tungsten portion 230 in the through hole 210. By a part of titanium deposited on the bottom surface of the through hole 210 being combined with silicon contained in the wiring layer 51, an alloy of titanium and silicon may be formed below the barrier metal layer 220 on the bottom surface of the through hole 210.

Figure 14:
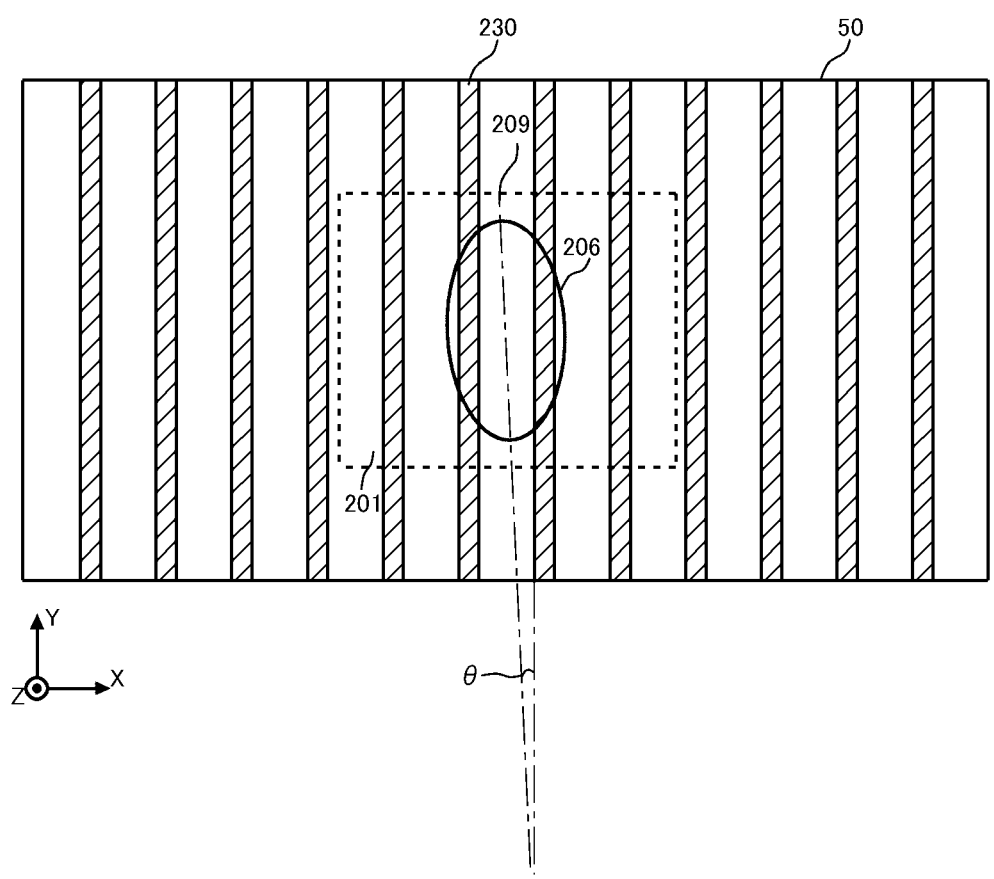
FIG. 14 is a figure showing an arrangement example of a connection region 206 on an upper surface of a gate pad 50.

FIG. 14 is a figure showing an arrangement example of a connection region 206 on an upper surface of a gate pad 50. As described above, the connection region 206 is the region where the connection portion 204 is provided. In the present example, the plurality of tungsten portions 230 of the stripe shape extending in a first direction (the Y axis direction in the present example) and the plurality of through holes 210 are provided. In addition, a long axis of the connection region 206 is indicated by a dash dotted line 209. The long axis of the connection region 206 is an axis on which the length of the connection region 206 is maximum in the XY plane. A direction in which a dash dotted line 209 extends is set as a second direction.

In the top plan view, an angle θ between the first direction and the second direction may be 10 degrees or less. The angle θ may be 5 degrees or less, or may be 0 degrees. That is, the long axis of the connection region 206 and the extension direction of the tungsten portion 230 may be substantially parallel.

As shown in FIG. 14, when the tungsten portion 230 of the stripe shape is provided, unevenness may occur on the upper surface of the gate pad 50 along a pattern of the tungsten portion 230. When the angle θ is large, the connection portion 204 straddles many tungsten portions 230. In this case, in a case where the connection portion 204 is to be bonded to the upper surface of the gate pad 50 by ultrasonic bonding, it may be difficult for a force, when ultrasonic waves are applied, to be transmitted to the connection portion 204. In contrast with this, by setting the angle θ to 10 degrees or less, it is possible to easily bond the connection portion 204 to the gate pad 50 by the ultrasonic bonding.

Figure 15:
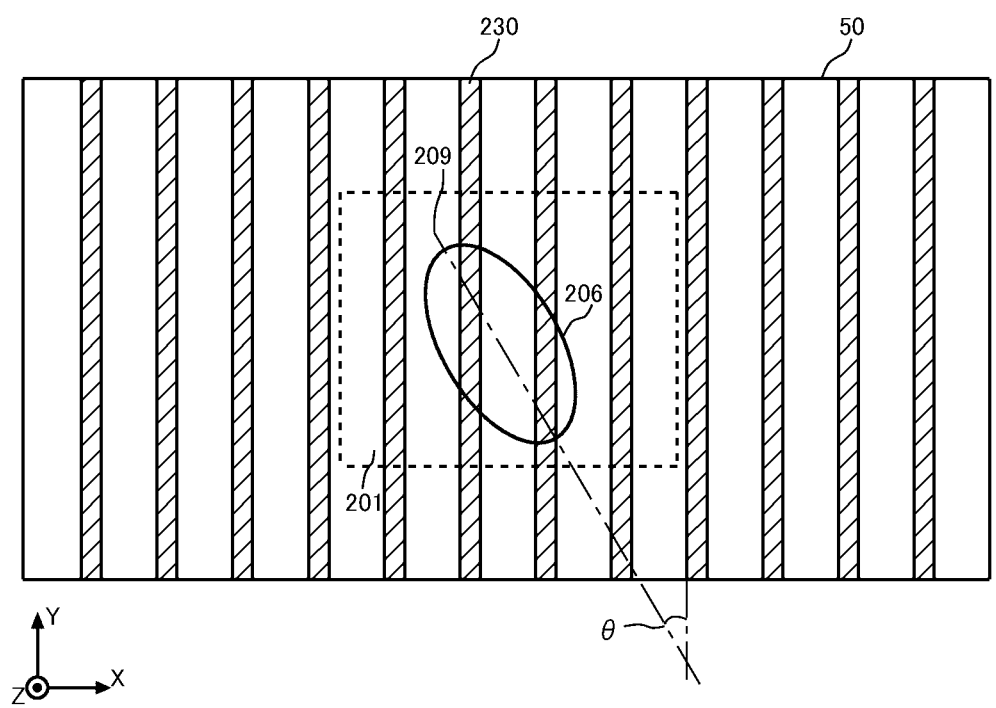
FIG. 15 is a figure showing another arrangement example of the connection region 206 on the upper surface of the gate pad 50.

FIG. 15 is a figure showing another arrangement example of the connection region 206 on the upper surface of the gate pad 50. In the present example, the angle θ between the first direction and the second direction is 30 degrees or more. The angle θ may be 45 degrees or more, or may be 60 degrees or more. In the present example, it is possible to increase the number of tungsten portions 230 straddled by the connection portion 204. In this case, the unevenness on the upper surface of the gate pad 50 in contact with the connection portion 204 increases, and thus it is possible to increase a contact area between the connection portion 204 and the gate pad 50. In addition, when the connection portion 204 is a fixing member such as solder, it is possible to strengthen the bonding between the connection portion 204 and the gate pad 50.

Figure 16:
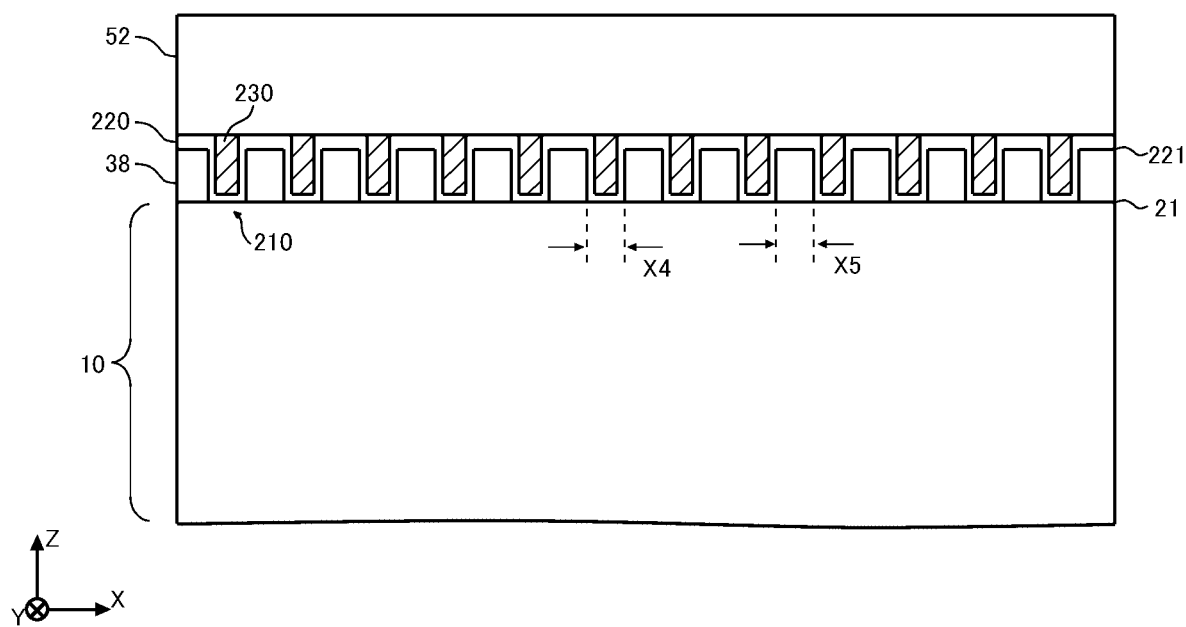
FIG. 16 is a figure showing an example of a cross section XZ in an active portion 120.

FIG. 16 is a figure showing an example of a cross section XZ in an active portion 120. On the semiconductor substrate 10, the region of the N type such as an emitter region, the region of the P type such as a collector region, the gate electrode, the gate dielectric film, and the like are formed, but are omitted in FIG. 16. In the active portion 120 as well, between the emitter electrode 52 and the upper surface 21 of the semiconductor substrate 10, the interlayer dielectric film 38, the through hole 210, the barrier metal layer 220, and the tungsten portion 230 may be provided. For example, the barrier metal layer 220 and the tungsten portion 230 may electrically connect the emitter electrode 52 and the upper surface 21 of the semiconductor substrate 10.

A width of the tungsten portion 230 or the through hole 210 in the active portion 120 in the X axis direction is set as X4. The width X4 of the tungsten portion 230 or the through hole 210 in the active portion 120 may be different from the width X1 of the tungsten portion 230 or the through hole 210 in the region below connection 208 described with reference to FIG. 1 to FIG. 15. In addition, a distance X5 between the through holes 210 in the active portion 120 in the X axis direction may be different from the distance X2 between the through holes 210 in the region below connection 208. For example, the width X1 of the through hole 210 in the region below connection 208 may be smaller than the width X4 of the through hole 210 below the emitter electrode 52. The reason why the width X1 may be smaller than the width X4 is that the structure of the element such as the gate electrode and the gate dielectric film is not formed in the gate pad 50, and thus in the gate pad 50, flatness is better in comparison with the active portion 120 and microfabrication is easy.

The tungsten portion 230 and the through hole 210 in the active portion 120 have the width X4 and the distance X5 suitable for extracting a carrier, and the tungsten portion 230 and the through hole 210 in the region below connection 208 have the width X1 and the distance X2 suitable for connecting the gate pad 50 and the wiring layer 51, and for suppressing the peeling of the gate pad 50. It should be noted that the interlayer dielectric film 38, the through hole 210, the barrier metal layer 220, and the tungsten portion 230 may be formed in the same manufacturing process in the regions below the active portion 120 and the gate pad 50.

A ratio S1/S of the area S1 of the tungsten portion 230 provided in the active portion 120, to a total area S of the active portion 120 is 20% or more, similarly to the gate pad 50. In addition, the S1/S in the active portion 120 may be approximately 25%.

Figure 17:
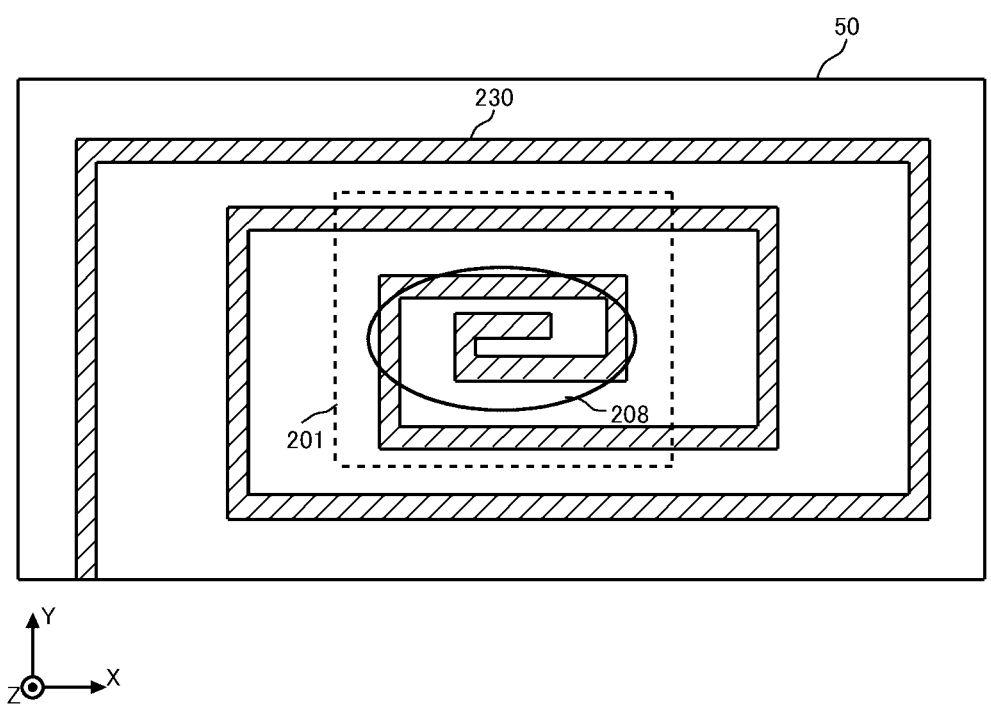
FIG. 17 is a figure showing another arrangement example of the tungsten portion 230 and the through hole 210 in the top plan view.

FIG. 17 is a figure showing another arrangement example of the tungsten portion 230 and the through hole 210 in the top plan view. The tungsten portion 230 and the through hole 210 of the present example are provided in a spiral shape in the region overlapping the gate pad 50. The center (or an end point) of the spiral may be arranged in the region below connection 208. The description of the through hole 210 is omitted in FIG. 17; however, the through hole 210 is formed in substantially the same region as the tungsten portion 230. In the region below connection 208, the area of the region where the through hole 210 is formed in the top plan view is set as S1, and the total area of the region below connection 208 is set as S, and the area ratio S1/S is set to be 20% or more. This makes it possible for the XY interface between the interlayer dielectric film 38 and the barrier metal layer 220 not to be peeled off. It should be noted that in FIG. 17, the through hole 210 is omitted. As a modification example, the tungsten portion 230 and the through hole 210 may not be arranged outside the opening region 201.

Figure 18:
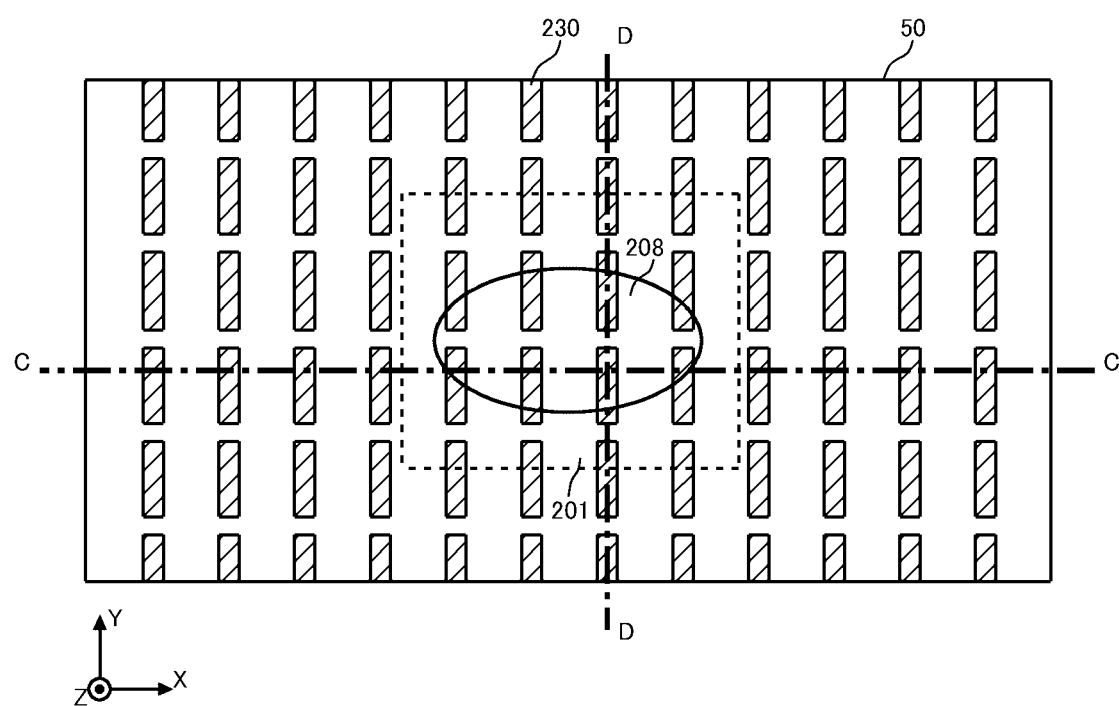
FIG. 18 is a figure showing another arrangement example of the tungsten portion 230 and the through hole 210 in the top plan view.

FIG. 18 is a figure showing another arrangement example of the tungsten portion 230 and the through hole 210 in the top plan view. In the example of FIG. 1 to FIG. 16, the tungsten portion 230 and the through hole 210 are arranged discretely in the X axis direction and continuously arranged in the Y axis direction. The tungsten portion 230 and the through hole 210 of the present example are arranged discretely in the Y axis direction. Other structures are similar to any of the examples in FIG. 1 to FIG. 16. The tungsten portion 230 and the through hole 210 may be arranged discretely in two directions, for example, as in the X axis direction and the Y axis direction. The description of the through hole 210 is omitted in FIG. 18; however, the through hole 210 is formed in substantially the same region as the tungsten portion 230. In the region below connection 208, the area of the region where the through hole 210 is formed in the top plan view is set as S1, and the total area of the region below connection 208 is set as S, and the area ratio S1/S is set to be 20% or more. This makes it possible for the XY interface between the interlayer dielectric film 38 and the barrier metal layer 220 not to be peeled off.

Figure 19:
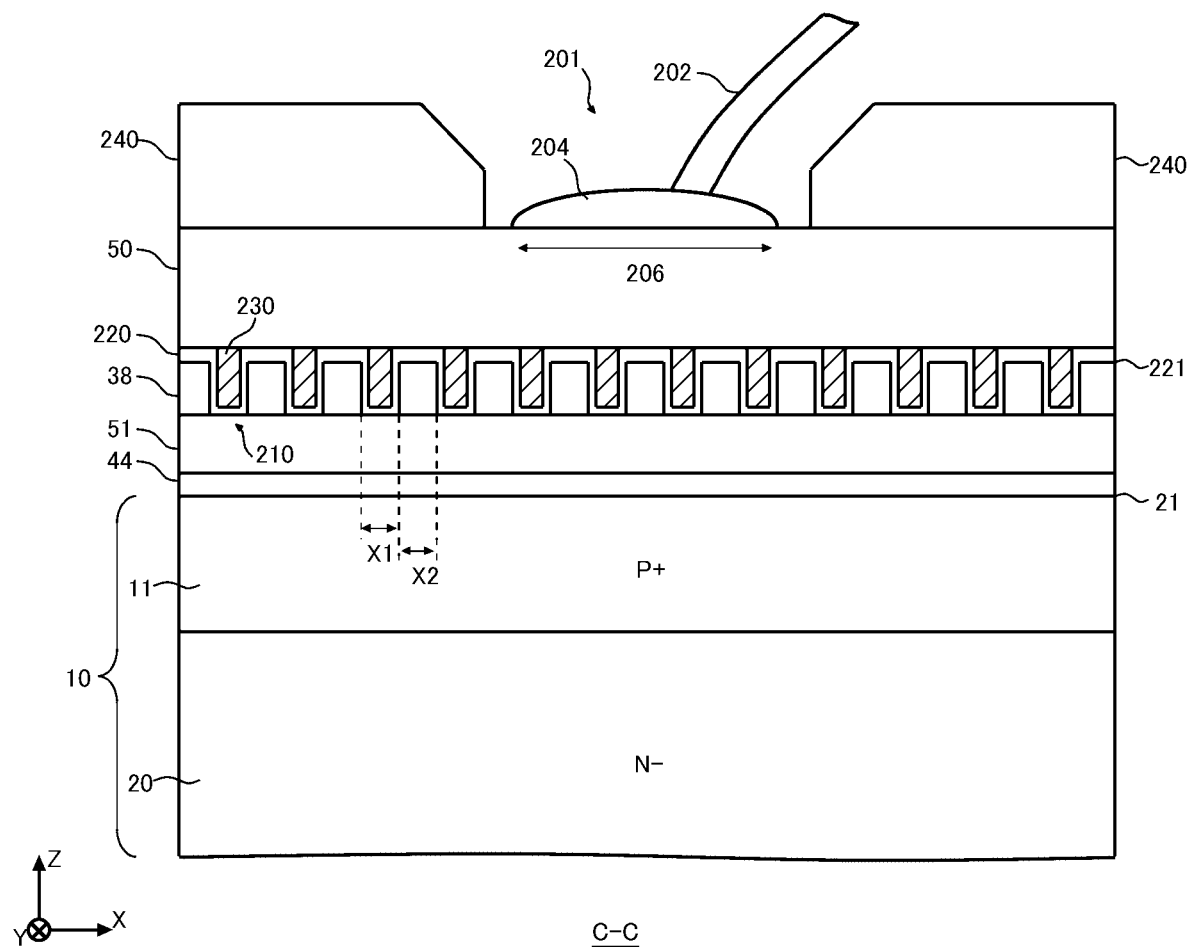
FIG. 19 is a figure showing an example of a cross section C-C in FIG. 18.

FIG. 19 is a figure showing an example of a cross section C-C in FIG. 18. The cross section C-C is an XZ plane passing through the gate pad 50 and the connection portion 204. FIG. 19 has a structure similar to that in FIG. 2A. A length of the through hole 210 in the X axis direction is set as the width X1. In addition, in the present example, the plurality of tungsten portions 230 are arranged at predetermined intervals along the X axis direction. The distance between the two adjacent through holes 210 in the X axis direction is set as the distance X2.

Figure 20:
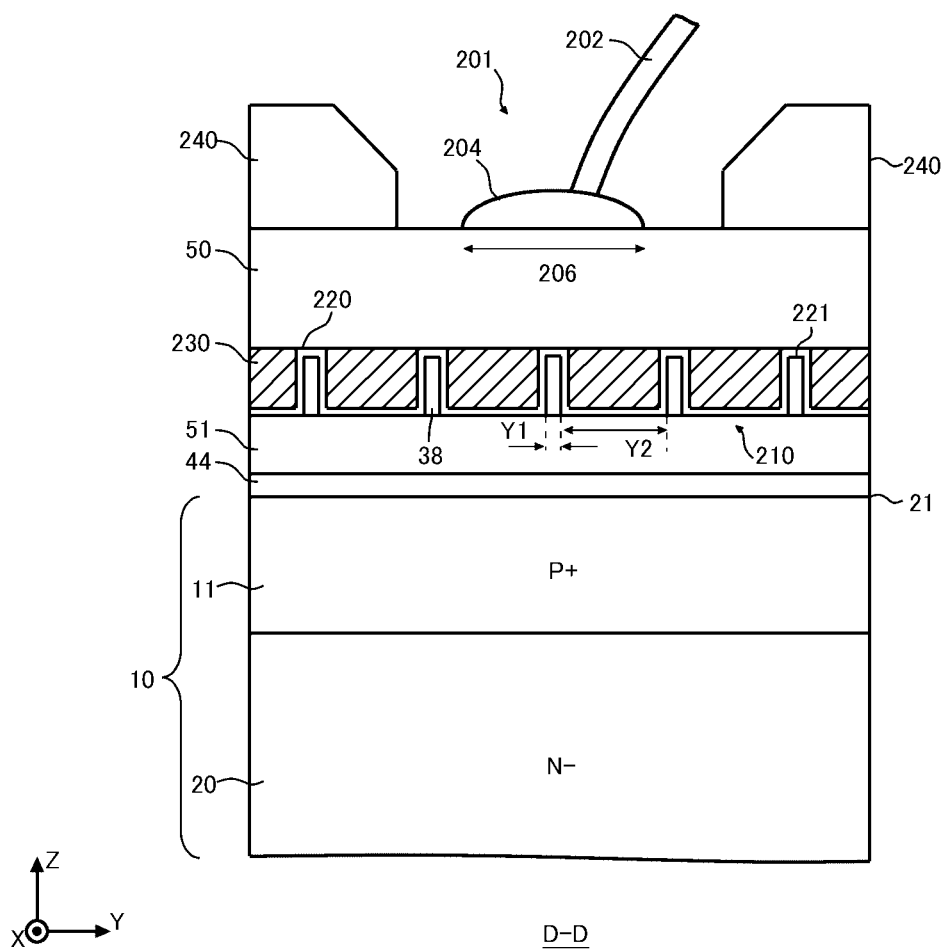
FIG. 20 is a figure showing an example of a cross section D-D in FIG. 18.

FIG. 20 is a figure showing an example of a cross section D-D in FIG. 18. The cross section D-D is a YZ plane passing through the gate pad 50 and the connection portion 204. A length of the through hole 210 in the Y axis direction is set as a width Y1. In addition, in the present example, the plurality of tungsten portions 230 are arranged at predetermined intervals along the Y axis direction. A distance between the two adjacent through holes 210 in the Y axis direction is set as the distance Y2. In the region below connection 208, when the area of the region where the through hole 210 is formed in the top plan view is set as S1, and the total area of the region below connection 208 is set as S, a relationship of $(X1 \times Y1)/((X1+X2) \times (Y1+Y2)) \geq 0.2$ may be satisfied for the area ratio S1/S is set to be 20% or more. For example, X1 may be 0.5 μm, X2 may be 1.5 μm, Y1 may be 5.0 μm, and Y2 may be 1.0 μm. It should be noted that in FIG. 18, the through hole 210 is omitted. As a modification example, the tungsten portion 230 and the through hole 210 may not be arranged outside the opening region 201.

In any of the examples described with reference to FIG. 1 to FIG. 20, the interlayer dielectric film 38 may be a BPSG film or a BSG film. A boron concentration in the interlayer dielectric film 38 may be 2.6 wt % or more and 5 wt % or less. More preferably, the boron concentration may be 2.7 wt % or more and 4.0 wt % or less. It should be noted that wt % indicates a weight percent concentration. When the boron concentration is too low, it is difficult to manufacture the interlayer dielectric film 38. The reason why it is difficult to manufacture the interlayer dielectric film 38 is that, for example, when the interlayer dielectric film 38 is heat-treated, deformation due to fluidization is unlikely to occur, a recess remains in the interlayer dielectric film 38 above a trench gate, and thus when the tungsten film is etched back, the tungsten easily remains in the recess. In addition, when the boron concentration is too high, a reaction between the titanium in the barrier metal layer 220 and the boron easily occurs, the adhesion of the interface between the barrier metal layer 220 and the interlayer dielectric film 38 becomes low, and thus the peeling easily occurs at this interface.

Figure 21:
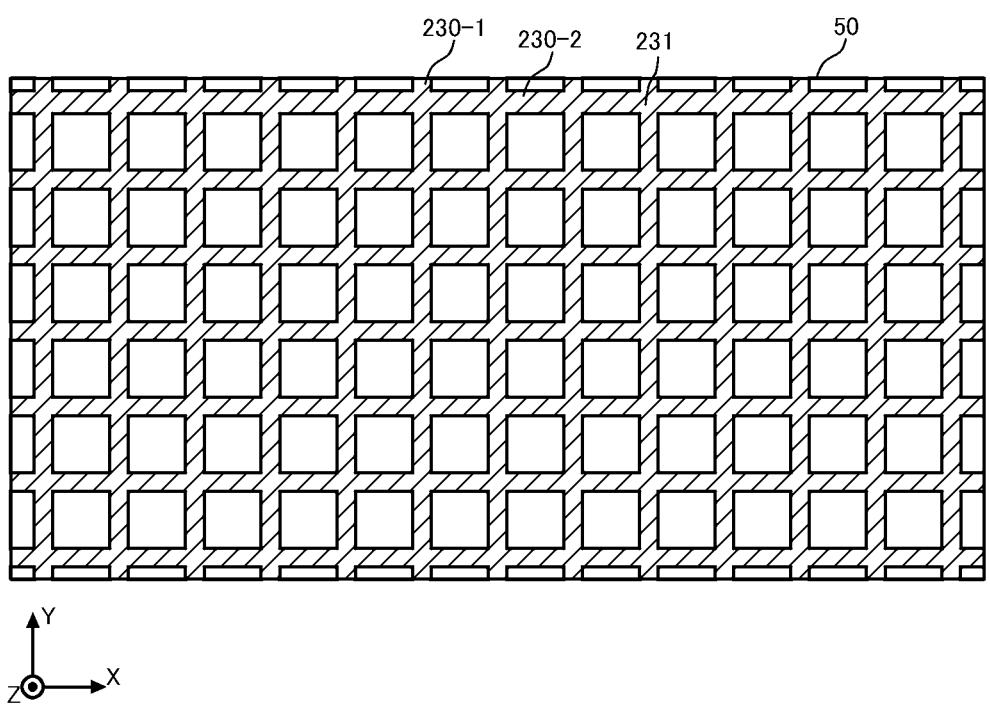
FIG. 21 is a figure showing another arrangement example of the tungsten portion 230 and the through hole 210 in the top plan view.

FIG. 21 is a figure showing another arrangement example of the tungsten portion 230 and the through hole 210 in the top plan view. In FIG. 21, the opening region 201 and the region below connection 208 are omitted; however, the opening region 201 and the region below connection 208 are provided at the positions similar to those in FIG. 1 to FIG. 20.

In the examples of FIG. 1 to FIG. 20, at least a part of the through hole 210 and the tungsten portion 230 is provided along a first extension direction (for example, the Y axis direction) parallel to the upper surface 21 of the semiconductor substrate 10. In the present example, a part of the through hole 210 and the tungsten portion 230 is provided along a second extension direction (for example, the X axis direction) which is parallel to the upper surface 21 of the semiconductor substrate 10 and is different from the first extension direction. Other structures are similar to any of the examples in FIG. 1 to FIG. 20. In FIG. 21, the tungsten portion 230 is shown; however, the through hole 210 is also arranged at a position corresponding to the tungsten portion 230. By providing the through hole 210 and the tungsten portion 230 along the two directions, it is easy to suppress the peeling of the interlayer dielectric film 38 and the barrier metal layer 220 against the pulling in various directions.

The semiconductor device 100 of the present example has a tungsten portion 230-1 and a tungsten portion 230-2 extending in the XY plane in directions different from each other. The tungsten portion 230-1 of the present example is provided to extend in the Y axis direction. For example, the tungsten portion 230-1 is a portion which has the stripe shape and has a longitudinal length in the Y axis direction. The tungsten portion 230-2 of the present example is provided to extend in the X axis direction. For example, the tungsten portion 230-2 is a portion which has the stripe shape and has a longitudinal length in the X axis direction.

The tungsten portion 230-1 and the tungsten portion 230-2 may be connected. In this case, the through hole 210 has a through hole connection portion 231 at a position where the tungsten portion 230-1 and the tungsten portion 230-2 are connected. The through hole connection portion 231 of the present example is a portion for joining the through hole 210 provided along the Y axis direction and the through hole 210 provided along the X axis direction.

The tungsten portion 230-1 and the tungsten portion 230-2 may intersect in the XY plane. That is, the tungsten portion 230-1 and the tungsten portion 230-2 may be provided to pass through each other in the XY plane. The tungsten portions 230-1 may be arranged at a predetermined cycle in the X axis direction. The tungsten portions 230-2 may be arranged at a predetermined cycle in the Y axis direction. The tungsten portion 230-1 and the tungsten portion 230-2 may be arranged in a grid pattern in the XY plane. In this case, the through hole connection portion 231 is arranged at a predetermined cycle in each of the X axis direction and the Y axis direction.

Figure 22:
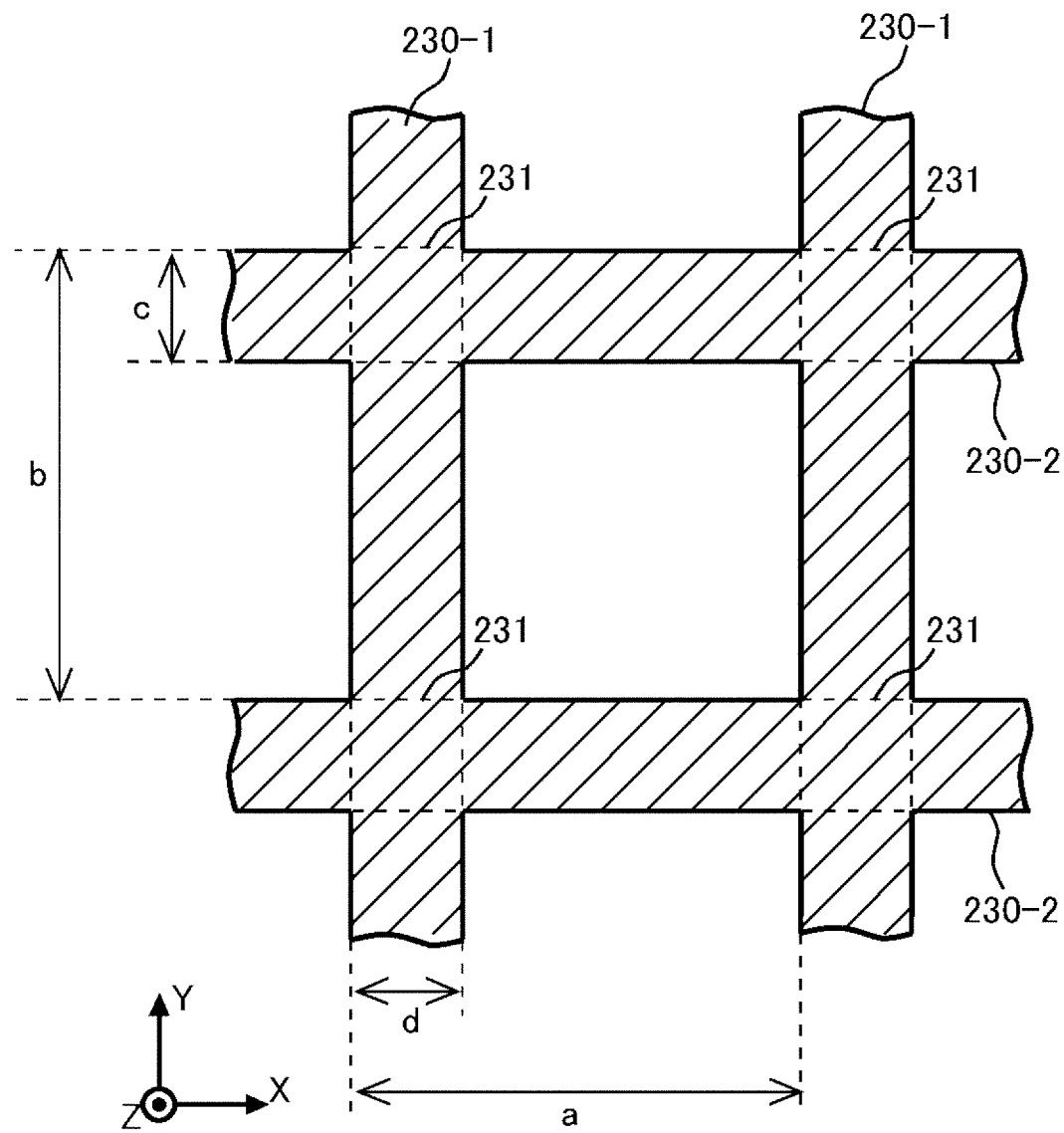
FIG. 22 is an enlarged view showing a tungsten portion 230-1 and a tungsten portion 230-2 shown in FIG. 21.

FIG. 22 is an enlarged view showing a tungsten portion 230-1 and a tungsten portion 230-2 shown in FIG. 21. In the present example, an interval between the through hole connection portions 231 arranged along the X axis direction is set as a, an interval between the through hole connection portions 231 arranged along the Y axis direction is set as b, a width of the through hole 210 arranged along the X axis direction is set as c, and a width of the through hole 210 arranged along the Y axis direction is set as d. As the width of the through hole 210, the width of the tungsten portion 230 may be used. In addition, the interval between the through hole connection portions 231 may use the cycle in which the tungsten portion 230 is arranged. The interval between the two through hole connection portions 231 is a distance between respective positions to the corresponding through hole connection portions 231. A distance between the centers of the through hole connection portions 231 may be set as the interval between the through hole connection portions 231. In addition, as shown in FIG. 22, a distance between edge sides of the through hole connection portion 231 on the same side may be set as the interval between the through hole connection portions 231. These widths and intervals may be measured at a height position of the upper end of the through hole 210.

The intervals a, b, and the widths c, d may satisfy the following expression: $((a \times c)+(b-c) \times d)/(a \times b) \geq 0.2$. That is, in the unit area $a \times b$, the area $(a \times c)+(b-c) \times d$ occupied by the through hole 210 or the tungsten portion 230 may be 20% or more. The area ratio may be 25% or more, or may be 30% or more. The examples described with reference to FIG. 1 to FIG. 20 are similar.

Figure 23:
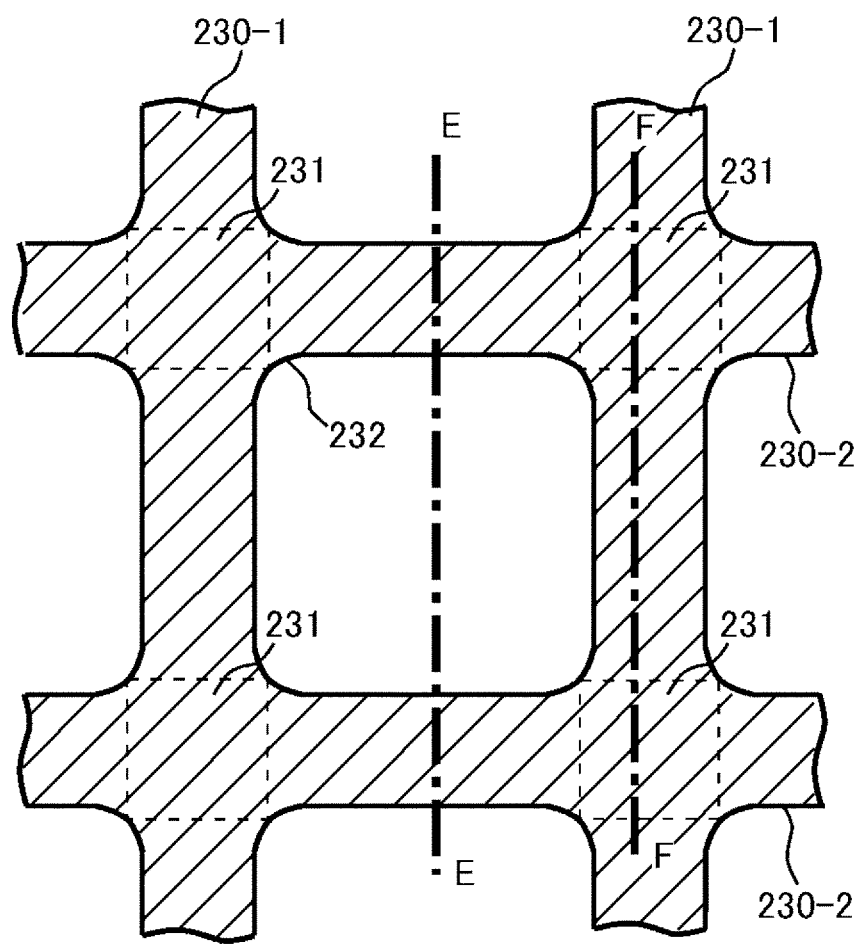
FIG. 23 is a figure showing another exemplary shape of the through hole 210 and the tungsten portion 230.
Figure 23:
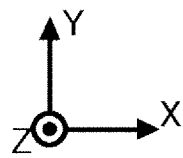

FIG. 23 is a figure showing another exemplary shape of the through hole 210 and the tungsten portion 230. The through hole 210 and the tungsten portion 230 of the present example may have a curved portion 232 in the XY plane parallel to the upper end of the through hole 210. When the interlayer dielectric film 38 is etched to form the through hole 210, the portion where the through hole 210 joins is easily etched. Therefore, the width of the through hole connection portion 231 may be larger than the width of the through hole 210 in another portion. For example, as shown in FIG. 23, in a vicinity of the through hole connection portion 231, the etching may be carried out in the XY plane such that the curved portion 232 appears on shapes of the upper surfaces of the through hole 210 and the tungsten portion 230. Thereby, the widths of the through hole 210 and the tungsten portion 230 in the through hole connection portion 231 are larger than the widths of the through hole 210 and the tungsten portion 230 in the other portion.

Figure 24:
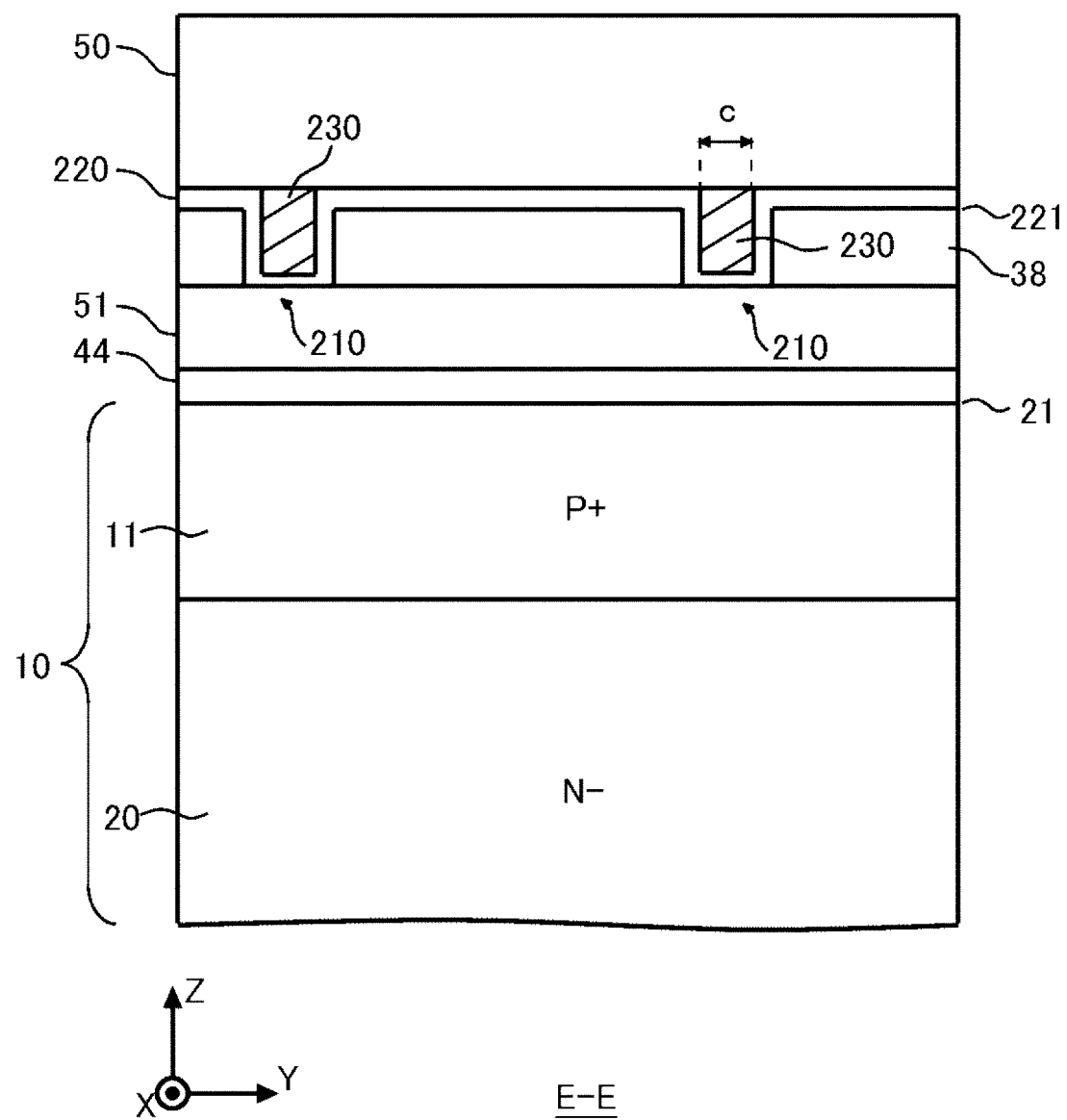
FIG. 24 is a figure showing an example of a cross section E-E in FIG. 23.

FIG. 24 is a figure showing an example of a cross section E-E in FIG. 23. The cross section E-E is a YZ plane intersecting the tungsten portion 230-2 at a position different from that of the tungsten portion 230-1. In FIG. 24, the connection portion 204 or the like provided on the gate pad 50 is omitted; however, similarly to the example of FIG. 20, the connection portion 204, the wire wiring portion 202, and the protective member 240 are provided on the gate pad 50. In another drawing as well, the connection portion 204, the wire wiring portion 202, and the protective member 240 may be omitted. With the present example as well, it is possible to reduce the area of the XY interface between the interlayer dielectric film 38 and the barrier metal layer 220. Accordingly, it is possible to suppress the peeling of the barrier metal layer 220 and the interlayer dielectric film 38.

Figure 25:
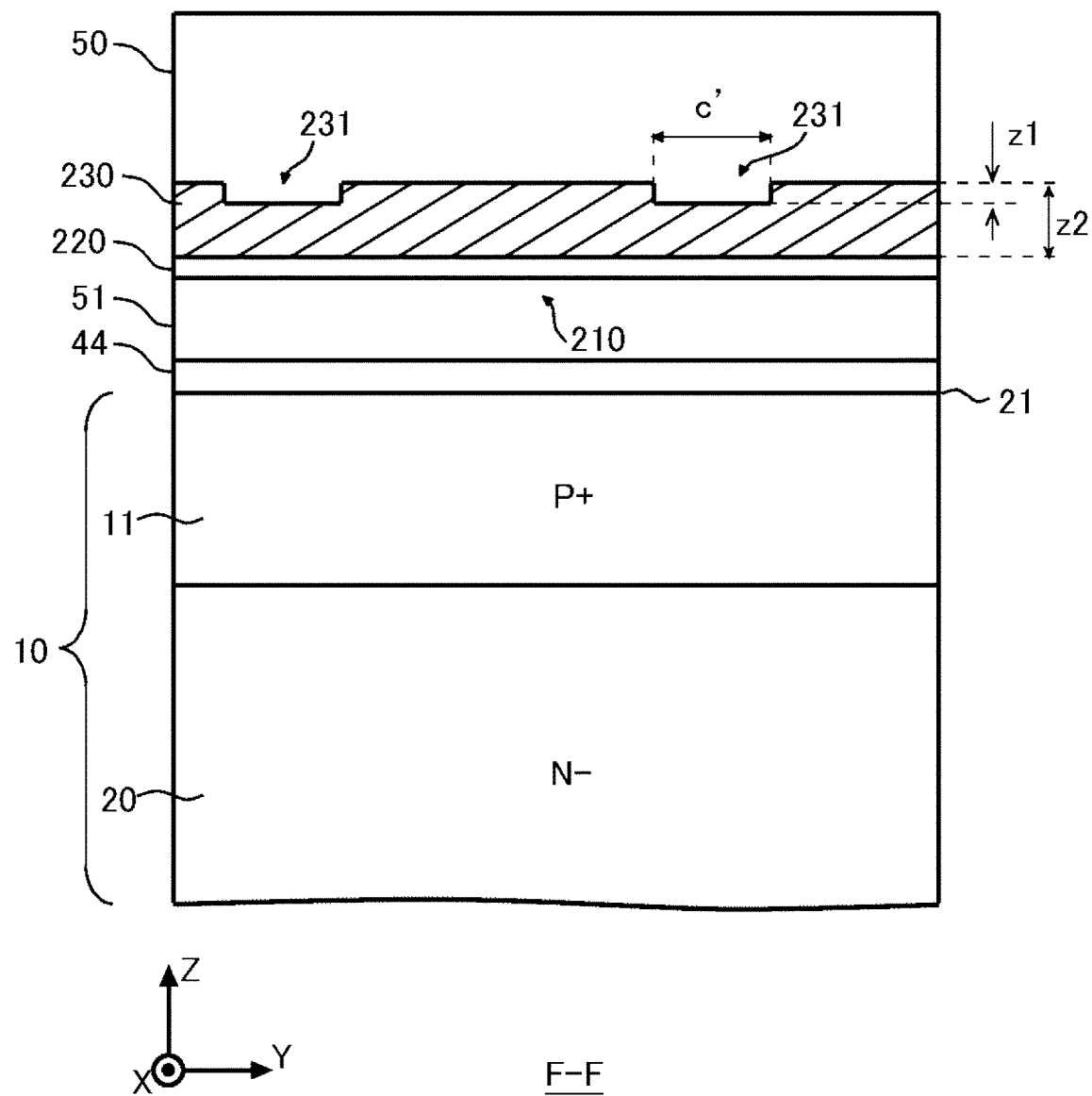
FIG. 25 is a figure showing an example of a cross section F-F in FIG. 23.

FIG. 25 is a figure showing an example of a cross section F-F in FIG. 23. The cross section F-F is a YZ plane passing through the through hole connection portion 231 along the tungsten portion 230-1. The upper end of the tungsten portion 230 provided in the through hole connection portion 231 is arranged on a lower side further than the upper end of the tungsten portion 230 provided in the through hole 210 other than the through hole connection portion 231. That is, the upper surface of the tungsten portion 230 is recessed toward the upper surface 21 of the semiconductor substrate 10 in the through hole connection portion 231. As described with reference to FIG. 23, the width of the through hole 210 is large in the vicinity of the through hole connection portion 231. Therefore, when the through hole 210 is filled with tungsten, the recess easily occurs in the through hole connection portion 231. By a step being provided on the upper surface of the tungsten portion 230, a contact area between the gate pad 50 and the tungsten portion 230 increases, and thus it is possible to enhance the adhesion between the gate pad 50 and the tungsten portion 230.

A thickness of the tungsten portion 230 in the region other than the through hole connection portion 231 is set as z2. As the thickness z2, a maximum value of the thickness of the tungsten portion 230 may be used. A depth of the recess of the tungsten portion 230 in the through hole connection portion 231 is set as z1. For the depth z1, a height difference between a peak of a ridge and a bottom of a valley, which are adjacent to each other on the upper surface of the tungsten portion 230, may be used. The depth z1 may be 5% or more of the thickness z2, may be 10% or more, or may be 20% or more. The depth z1 may be 50% or less of the thickness z2, or may be 30% or less. This makes it possible to maintain the thickness of the tungsten portion 230 to a certain degree, and to enhance the adhesion between the tungsten portion 230 and the gate pad 50. A width of the recess on the upper surface of the tungsten portion 230 is set as c'. The width c' in the present example is a width in the Y axis direction. The width c' may be larger than a width c of the tungsten portion 230-2.

Figure 26:
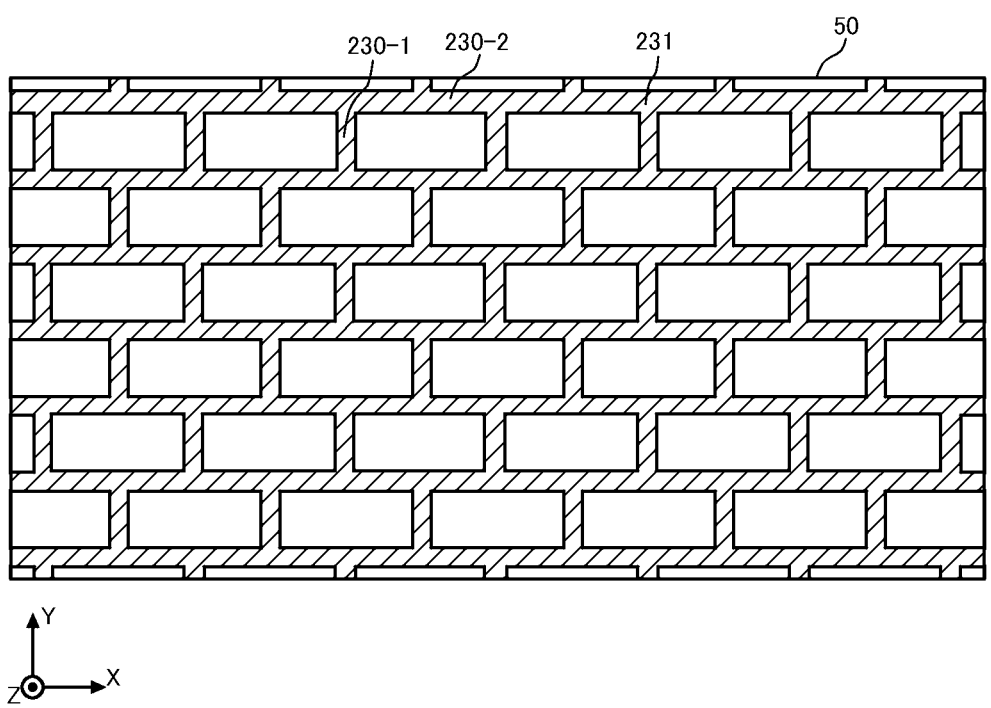
FIG. 26 is a figure showing another arrangement example of the tungsten portion 230 and the through hole 210 in the top plan view.

FIG. 26 is a figure showing another arrangement example of the tungsten portion 230 and the through hole 210 in the top plan view. In the present example, the tungsten portion 230-1 is connected to the tungsten portion 230-2, but does not pass through the tungsten portion 230-2. That is, the tungsten portion 230-1 is connected to the tungsten portion 230-2 in a T shape. Other structures are similar to those in the example in FIG. 21. In the present example as well, the through hole connection portion 231 is provided at a connection portion between the tungsten portion 230-1 and the tungsten portion 230-2.

Figure 27:
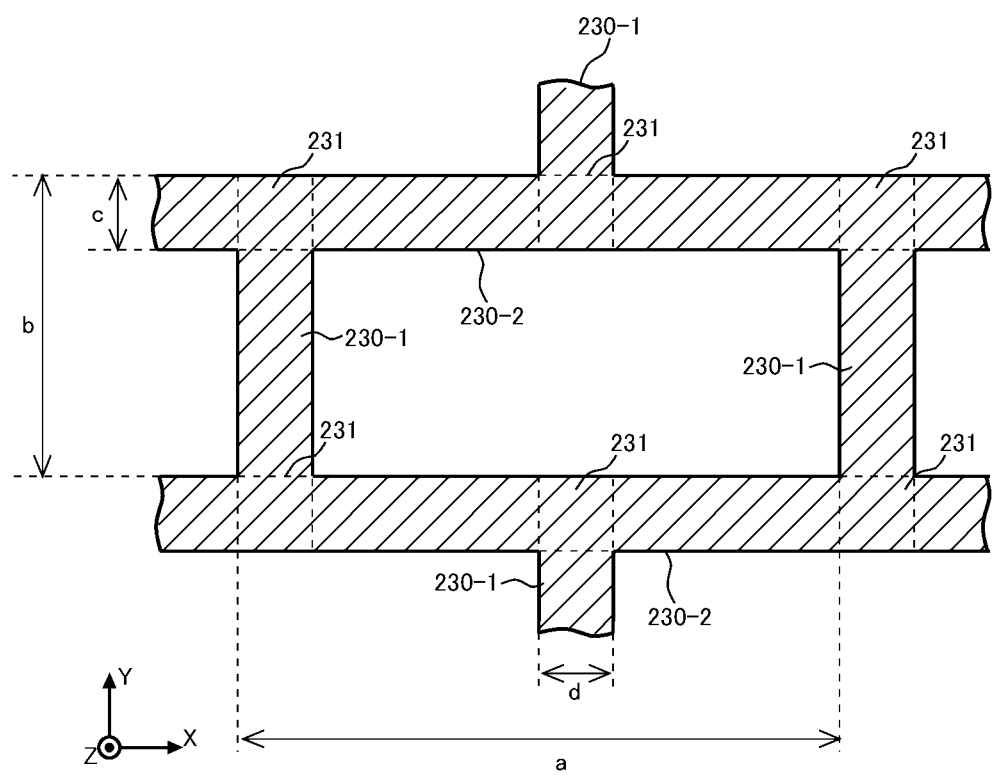
FIG. 27 is an enlarged view showing the tungsten portion 230-1 and the tungsten portion 230-2 shown in FIG. 26.

FIG. 27 is an enlarged view showing the tungsten portion 230-1 and the tungsten portion 230-2 shown in FIG. 26. In the present example, the tungsten portion 230-1 is connected to the tungsten portion 230-2 in a T shape. Other structures are similar to those in FIG. 22 or FIG. 23.

In the present example as well, the interval between the through hole connection portions 231 arranged along the X axis direction is set as a, the interval between the through hole connection portions 231 arranged along the Y axis direction is set as b, the width of the through hole 210 arranged along the X axis direction is set as c, and the width of the through hole 210 arranged along the Y axis direction is set as d.

Similarly to the example of FIG. 22, the intervals a, b, and the widths c, d may satisfy the following expression: $((a \times c)+(b-c) \times d)/(a \times b) \geq 0.2$. That is, in the unit area $a \times b$, the area $(a \times c)+(b-c) \times d$ occupied by the through hole 210 or the tungsten portion 230 may be 20% or more. The area ratio may be 25% or more, or may be 30% or more.

Figure 28:
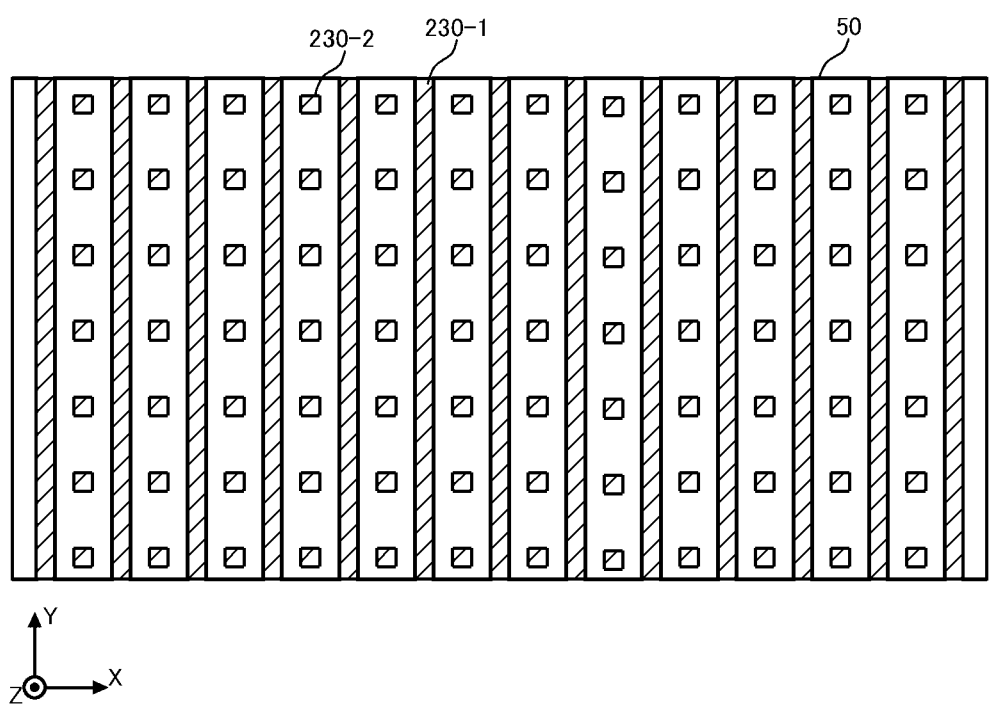
FIG. 28 is a figure showing another arrangement example of the tungsten portion 230 and the through hole 210 in the top plan view.

FIG. 28 is a figure showing another arrangement example of the tungsten portion 230 and the through hole 210 in the top plan view. In the present example, at least either the tungsten portions 230-1 or the tungsten portion 230-2 are discretely arranged in the extension direction. In the example of FIG. 28, the tungsten portions 230-2 are arranged discretely along the X axis direction. The tungsten portions 230-2 are also arranged discretely in the Y axis direction.

As described with reference to FIG. 2B, the trench 25 is provided to extend in the Y axis direction. In the example of FIG. 28, the tungsten portion 230-1 extending in the Y axis direction and the through hole 210 are continuously provided in the gate pad 50 in the Y axis direction. On the other hand, in the X axis direction, the tungsten portions 230-2 are discretely arranged. With such a configuration, it is possible to reduce the unevenness of the upper surface of the tungsten portion 230 in a direction parallel to the trench 25, and it is possible to reduce the variation in connectivity between the trench 25 and the gate pad 50. In another example, the tungsten portions 230-2 may be provided continuously in the X axis direction, and the tungsten portions 230-1 may be discretely provided in the Y axis direction.

The tungsten portions 230-2 may be arranged at a predetermined cycle in the X axis direction. The tungsten portion 230-2 may be connected to, or separated from the tungsten portion 230-1. When the tungsten portion 230-2 is connected to the tungsten portion 230-1, the through hole connection portion 231 may be provided at the connection portion. As shown in FIG. 28, one tungsten portion 230-2 may be arranged between two tungsten portions 230-1 in the X axis direction. In another example, two or more tungsten portions 230-2 may be arranged between two tungsten portions 230-1 in the X axis direction.

Figure 29:
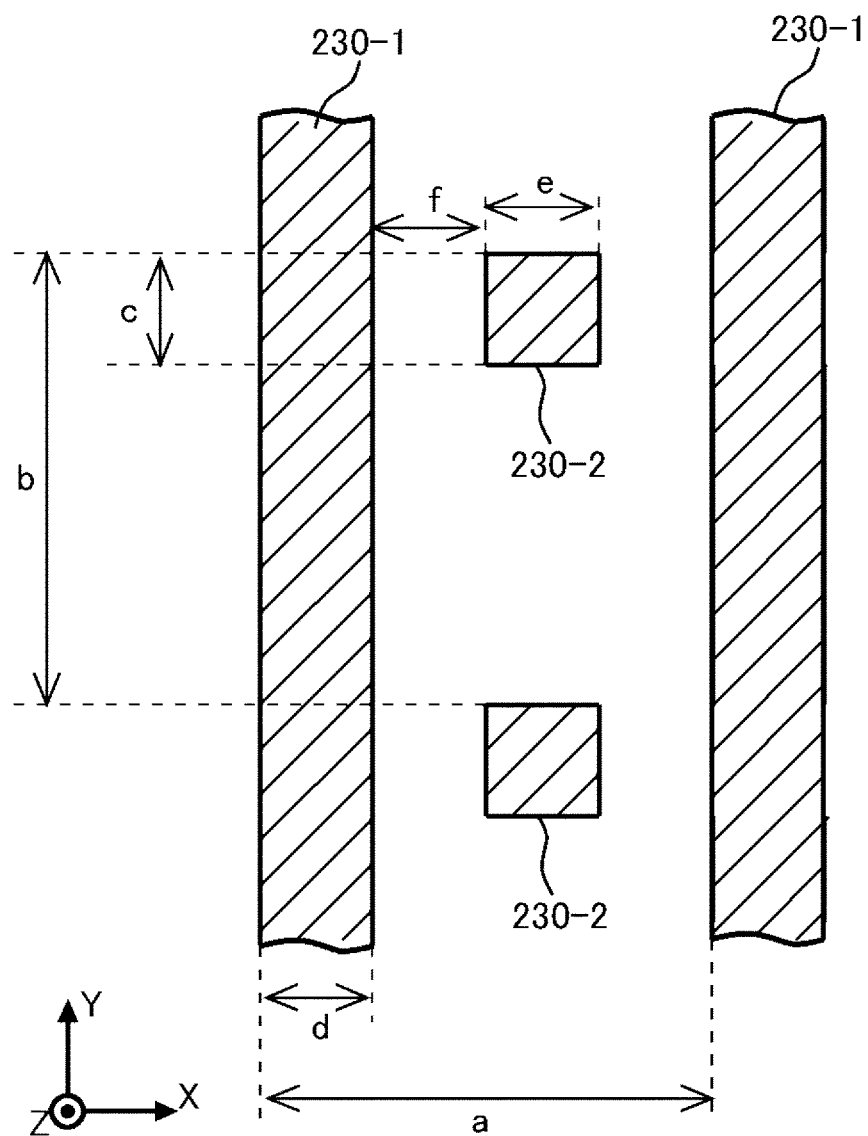
FIG. 29 is an enlarged view showing the tungsten portion 230-1 and the tungsten portion 230-2 shown in FIG. 28.

FIG. 29 is an enlarged view showing the tungsten portion 230-1 and the tungsten portion 230-2 shown in FIG. 28. In the present example, the tungsten portion 230-1 and the tungsten portion 230-2 are separated from each other. Other structures are similar to those in FIG. 22 or FIG. 23.

In the present example as well, the interval between the through hole connection portions 231 arranged along the X axis direction is set as a, the interval between the through hole connection portions 231 arranged along the Y axis direction is set as b, a width of the through hole 210 filled with the tungsten portion 230-2 in the Y axis direction is set as c, and the width of the through hole 210 arranged along the Y axis direction is set as d. In addition, a width of the through hole 210 filled with the tungsten portion 230-2 in the X axis direction is set as e, and a distance between the through hole 210 filled with the tungsten portion 230-1 and the through hole 210 filled with the tungsten portion 230-2, in the X axis direction, is set as f. The distance f is the shortest distance between the tungsten portion 230-1 and the tungsten portion 230-2.

The intervals a, b, widths c, d, e, and distance f may satisfy the following expression: $((B \times d)+(e \times c))/(a \times b) \geq 0.2$. That is, in the unit area $a \times b$, the area $(b \times d)+(e \times c)$ occupied by the through hole 210 or the tungsten portion 230 may be 20% or more. The area ratio may be 25% or more, or may be 30% or more.

Figure 30:
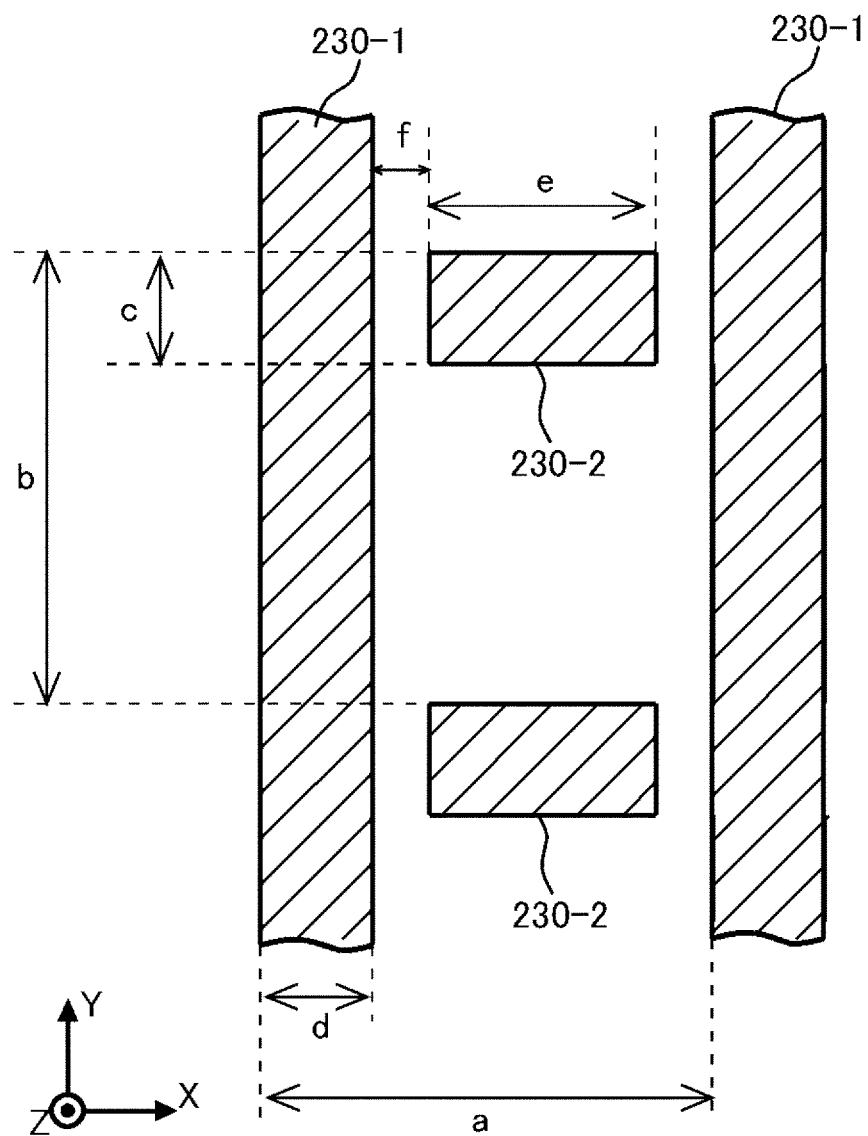
FIG. 30 is an enlarged view showing other examples of the tungsten portion 230-1 and the tungsten portion 230-2 shown in FIG. 28.

FIG. 30 is an enlarged view showing other examples of the tungsten portion 230-1 and the tungsten portion 230-2 shown in FIG. 28. In the present example, each tungsten portion 230-2 has a longitudinal length in the X axis direction. That is, the width e is larger than the width c. In another example, the width e may be the same as the width c, or the width e may be smaller than the width c.

In the present example as well, the tungsten portion 230-1 provided along the Y axis direction, and the tungsten portion 230-2 provided along the X axis direction may be arranged to be separated from each other. The width e may be larger than the distance f.

Figure 31:
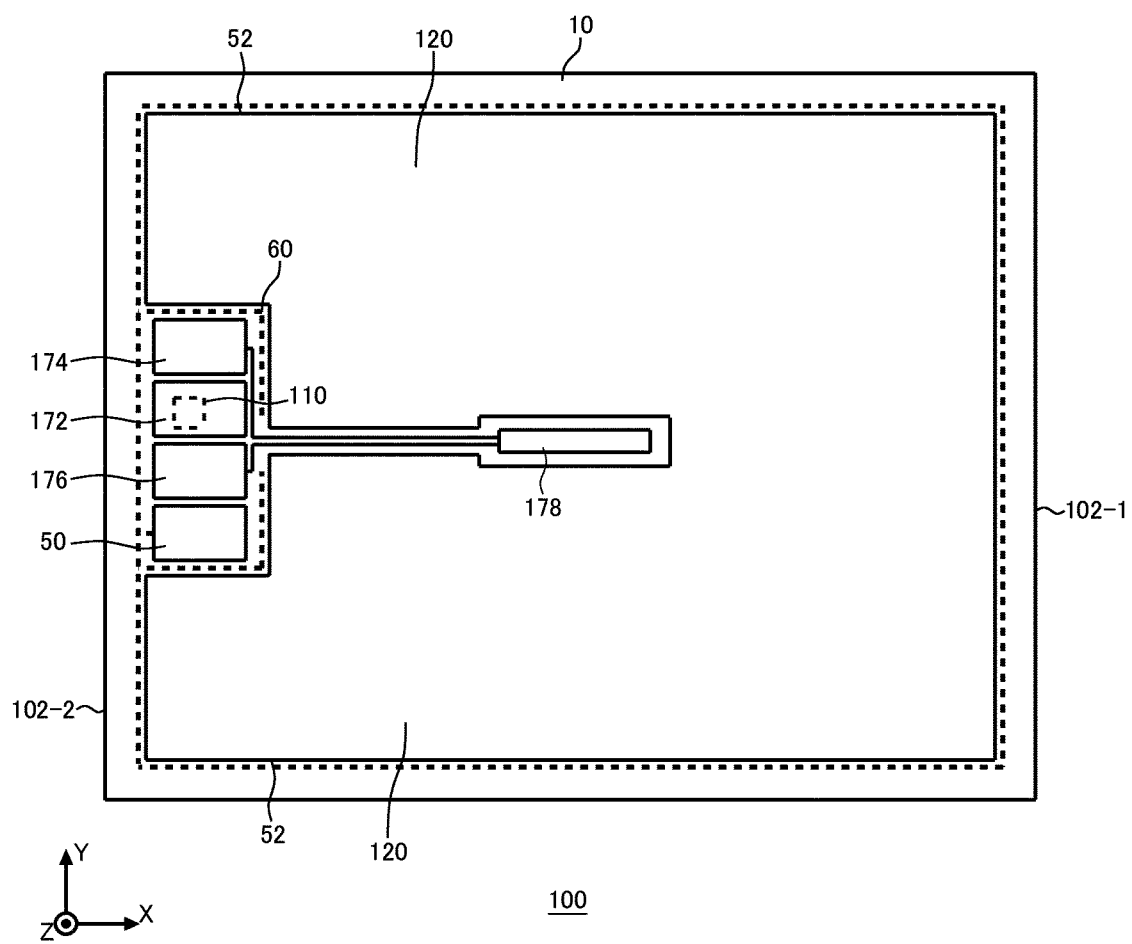
FIG. 31 is a figure showing an arrangement example of a gate runner 60 in the semiconductor device 100.

FIG. 31 is a figure showing an arrangement example of a gate runner 60 in the semiconductor device 100. In FIG. 31, the gate runner 60 is shown by a dashed line. The gate runner 60 is wiring for connecting the gate pad 50 and the gate electrode 24 shown in FIG. 2B. A gate potential is applied to the gate runner 60 from the gate pad 50. The gate runner 60 of the present example is provided above the semiconductor substrate 10. The gate runner 60 is formed of a conductive material such as polysilicon to which the impurity is added.

In FIG. 31, the arrangement of each pad is different from that in the example in FIG. 1; however, the arrangement of the pads may be similar to that in the example in FIG. 1. In the present example, the anode pad 174, the current sensing pad 172, the cathode pad 176, and the gate pad 50 are arranged in order along the edge side 102-2. The gate runner 60 is arranged to surround a periphery of the active portion 120. In addition, the gate runner 60 may also be arranged between each pad and the active portion 120.

Figure 32:
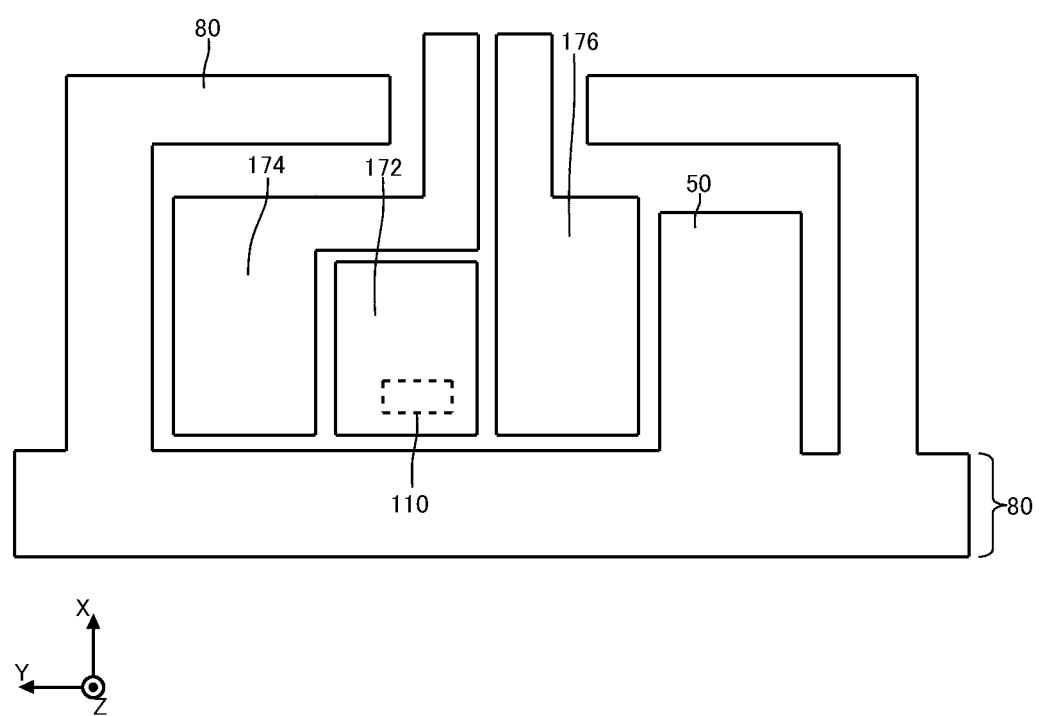
FIG. 32 is an enlarged top plan view of a vicinity of each pad.

FIG. 32 is an enlarged top plan view of a vicinity of each pad. As described above, the anode pad 174, the current sensing pad 172, the cathode pad 176, and the gate pad 50 are arranged in order along the Y axis direction. Each pad may be provided with the wire wiring portion 202 and the connection portion 204 described with reference to FIG. 2A or the like. A part of a gate metal portion 80 is arranged to surround the anode pad 174, the current sensing pad 172, the cathode pad 176, and the gate pad 50. The anode pad 174, the current sensing pad 172, the cathode pad 176, the gate pad 50, and the gate metal portion 80 may be formed in the same step. The gate pad 50 and the gate metal portion 80 may be connected to each other.

Figure 33:
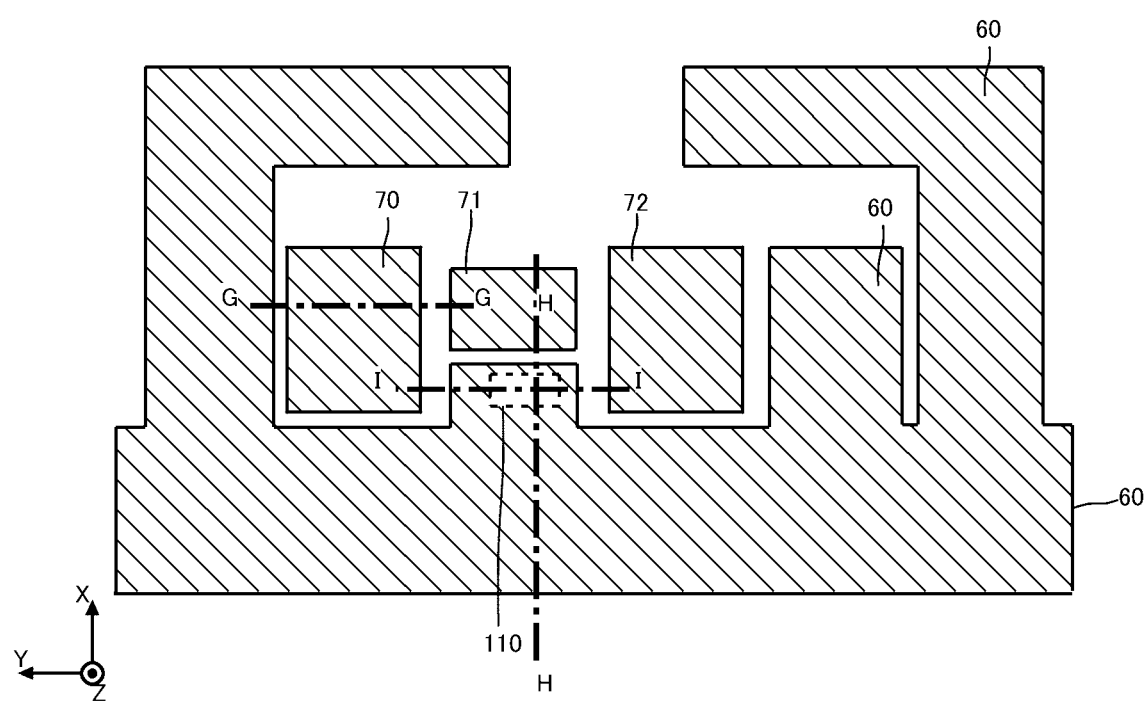
FIG. 33 is a top plan view showing an arrangement example of the gate runner 60 in the vicinity of each pad.

FIG. 33 is a top plan view showing an arrangement example of the gate runner 60 in the vicinity of each pad. In FIG. 33, the gate runner 60, a separated conductive portion 71 below the current sensing pad 172, a separated conductive portion 70 below the anode pad 174, and a separated conductive portion 72 below the cathode pad 176 are hatched with diagonal lines. The gate runner 60 is provided, in the height direction (a Z direction), in a region between the upper surface 21 of the semiconductor substrate 10, and each pad. The arrangement of each pad is the same as that in FIG. 32. The gate runner 60, the separated conductive portion 70, the separated conductive portion 71, and the separated conductive portion 72 may be formed in the same step.

A part of the gate runner 60 is arranged below the gate pad 50. The gate runner 60 is electrically connected to the gate pad 50 via the contact hole or the like. The gate runner 60 may be provided to surround the active portion 120 (refer to FIG. 31) along the edge side 102 (refer to FIG. 31) of the semiconductor substrate 10.

The gate runner 60 is electrically connected to the gate electrode 24 of the transistor portion of the current sensing region 110. The current sensing region 110 has a structure similar to that of the transistor portion shown in FIG. 2A. A part of the gate runner 60 may be arranged below the current sensing pad 172.

The current sensing region 110 has a small area which is $\frac{1}{1000}$ or less of the active portion 120. The current sensing region 110 is connected to an IC that detects the flowing current. The IC detects a voltage which is generated when the generated current flows between sense resistors, and interrupts the current flowing through the semiconductor device 100 when it is determined that the current is flowing too much. On the other hand, the diode element 178 (refer to FIG. 31) that detects the temperature has a PN diode formed in series at the center of the chip, and has a temperature dependence. The diode element 178 is an example of a sensing portion that detects a temperature rise by the connected IC. The current and the temperature are examples of physical information. The anode pad 174, the current sensing pad 172, and the cathode pad 176 are examples of the sensing pad portion that is connected to the sensing portion. It should be noted that the sensing portion and the sensing pad portion are not limited to these examples.

The separated conductive portions 70, 71, 72 separated from the gate runner 60 are provided between the anode pad 174, the current sensing pad 172, and the cathode pad 176, and the upper surface 21 of the semiconductor substrate 10. The separated conductive portions 70, 71, 72 are formed of a conductive material, and are insulated from the gate runner 60 by the dielectric film or the like. The separated conductive portions 70, 71, 72 may be formed of the same material as the gate runner 60. The separated conductive portions 70, 71, 72 of the present example are formed of polysilicon. A potential different from that of the gate runner 60 is applied to the separated conductive portions 70, 71, 72. At least some of the separated conductive portions 70, 71, 72 may be arranged at the same height as the gate runner 60.

An area of the separated conductive portion 70 provided on the anode pad 174, the current sensing pad 172, and the cathode pad 176, in the top plan view, may be 25% or more, 50% or more, or 100% of the area of each pad. An area of the anode pad 174 and the cathode pad 176 may be an area of a rectangular portion in the top plan view.

As a reference example, a structure, in which the gate runner 60 is also provided below the anode pad 174, the current sensing pad 172, and the cathode pad 176, can be considered. However, when the gate runner 60 is also arranged below these pads, each pad and the gate runner 60 are capacitively coupled, and the gate potential affects the potential of each pad. Thereby, a current of a current sensing portion or a diode characteristic of a temperature sensor may deviate, and the detection IC may erroneously detect the current or the temperature.

According to the present example, the area of the gate runner 60 below the anode pad 174, the current sensing pad 172, and the cathode pad 176 is reduced or the area is set to be zero. Thereby, there is no capacitive coupling between each pad and the gate runner 60, and there is no influence of the gate potential on the potential of each pad, and thus there is no erroneous detection of the detection IC. In addition, by providing the gate runner 60 or the separated conductive portions 70, 71, 72 under each pad, a height position of each pad is easily made to be uniform.

Figure 34:
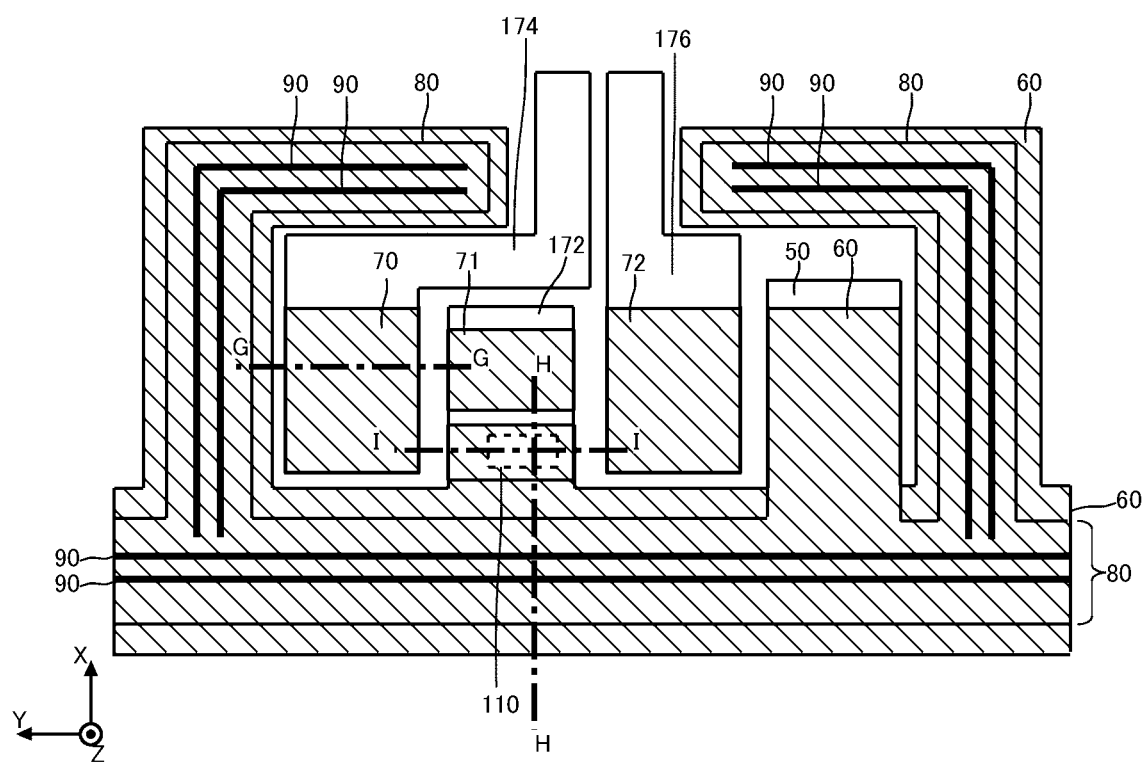
FIG. 34 is a figure showing, in an overlapping manner, a gate metal portion 80 and each pad shown in FIG. 32, and the gate runner 60 and separated conductive portions 70, 71, 72 shown in FIG. 33.

FIG. 34 is a figure showing, in an overlapping manner, a gate metal portion 80 and each pad shown in FIG. 32, and the gate runner 60 and separated conductive portions 70, 71, 72 shown in FIG. 33. The gate metal portion 80 is wiring formed of a metal material. The gate metal portion 80 may be formed of the same material as the gate pad 50. The gate metal portion 80 is connected to the gate pad 50.

The gate metal portion 80 of the present example is arranged above the gate runner 60. The gate metal portion 80 may be provided at the same height as the gate pad 50. The gate metal portion 80 is provided along the gate runner 60. The gate metal portion 80 may be provided to surround the active portion 120. The dielectric film such as the interlayer dielectric film 38 is provided between the gate metal portion 80 and the gate runner 60. The dielectric film is provided with a contact hole 90 for connecting the gate metal portion 80 and the gate runner 60. The contact hole 90 may be provided along the gate metal portion 80. The contact hole 90 may be provided to surround the active portion 120.

Figure 35:
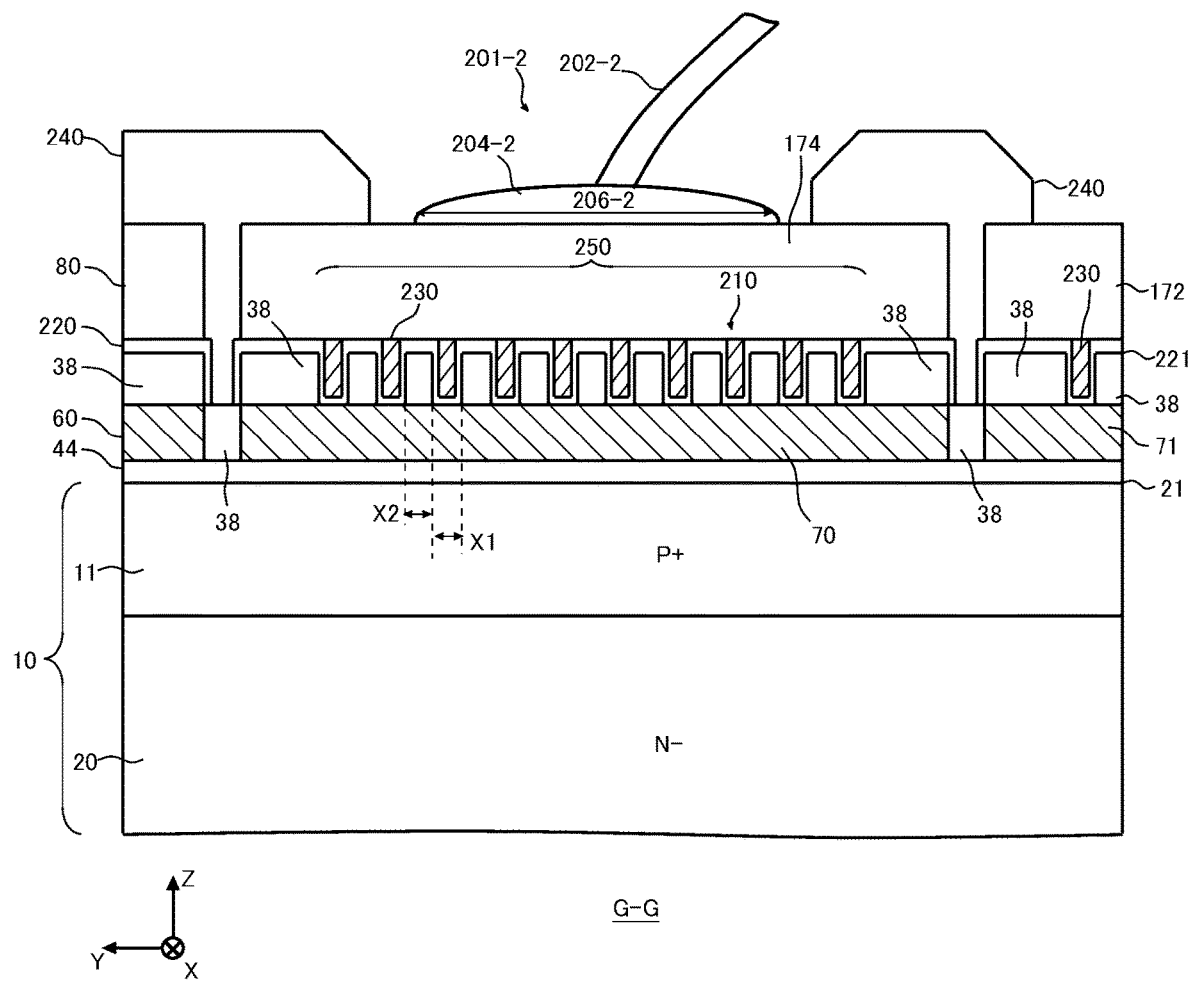
FIG. 35 is a figure showing an example of a cross section G-G in FIG. 33 and FIG. 34.

FIG. 35 is a figure showing an example of a cross section G-G in FIG. 33 and FIG. 34. The cross section G-G is a YZ plane passing through a part of the gate metal portion 80, the anode pad 174, and a part of the current sensing pad 172. Each pad is arranged above the interlayer dielectric film 38. Each pad may be formed at the same height. A dielectric material such as the protective member 240 may be provided between the respective pads.

The barrier metal layer 220 may be provided between each pad and the interlayer dielectric film 38. In addition, the barrier metal layer 220 below each pad may be separated for each pad. The dielectric material such as the protective member 240 may be provided between the respective barrier metal layers 220.

The gate runner 60 is provided below the gate metal portion 80. The gate runner 60 is arranged between the interlayer dielectric film 38 and the upper surface 21 of the semiconductor substrate 10. The separated conductive portion 70 is provided below the anode pad 174. The dielectric material such as the interlayer dielectric film 38 may be provided between the separated conductive portion 70 and the gate runner 60. The separated conductive portion 71 is provided below the current sensing pad 172. The separated conductive portion 71 is separated from the separated conductive portion 70. That is, the separated conductive portion is separated for each pad. The dielectric material such as the interlayer dielectric film 38 may be provided between the separated conductive portion 71 and the separated conductive portion 70.

The gate runner 60, and at least one of the separated conductive portion 70 and the separated conductive portion 71 may have the same thickness. A height range in which the separated conductive portion 70 and the separated conductive portion 71 are provided, and a height range in which the gate runner 60 is provided may at least partially overlap. The height ranges may match each other. In addition, the gate runner 60, the separated conductive portion 70, and the separated conductive portion 71 are arranged between the interlayer dielectric film 38 and the upper surface 21 of the semiconductor substrate 10. The gate runner 60, the separated conductive portion 70, and the separated conductive portion 71 may be formed by the same manufacturing process. For example, the gate runner 60, the separated conductive portion 70, and the separated conductive portion 71 may be formed by forming a polysilicon layer above the upper surface 21 of the semiconductor substrate 10 and patterning the polysilicon layer.

The separated conductive portion 70 and the separated conductive portion 71 of the present example are electrically connected to the pad portion above. For example, the anode pad 174 and the separated conductive portion 70 are connected by an interlayer connection portion 250. Below the gate pad 50 described with reference to FIG. 1 to FIG. 30, the interlayer connection portion 250 has a configuration similar to those of the interlayer dielectric film 38, the barrier metal layer 220, the through hole 210, and the tungsten portion 230. In addition, the size of each member such as the width X1 of the through hole 210 and the interval X2 of the through hole 210, and the area ratio occupied by each member such as S1/S are similar to those in examples described with reference to FIG. 1 to FIG. 30.

Each pad portion may be provided with the opening region 201, the wire wiring portion 202, the connection portion 204, and the connection region 206 described with reference to FIG. 1 to FIG. 30. The relationship between these configurations and the interlayer connection portion 250 is similar to those in examples described with reference to FIG. 1 to FIG. 30.

For example, the interlayer dielectric film 38 has the through hole 210 below the connection region 206. The tungsten portion 230 is provided inside the through hole 210. In addition, the barrier metal layer 220 is provided on the upper surface of the interlayer dielectric film 38 and an inner wall of the through hole 210. In the region below connection 208 (refer to FIG. 3) that overlaps the connection region 206, the area S1' of the region provided with the tungsten portion 230 may be 20% or more of the area S of the region below connection 208. With such a configuration, it is possible to suppress the peeling of the barrier metal layer 220 and the interlayer dielectric film 38.

In addition, the through hole 210 and the tungsten portion 230 may be provided along the first extension direction (for example, the X axis direction or the Y axis direction) similarly to the examples described with reference to FIG. 1 to FIG. 20. In addition, the through hole 210 and the tungsten portion 230 may be provided along both of the first extension direction and the second extension direction (for example, the X axis direction and the Y axis direction) similarly to the examples described with reference to FIG. 21 to FIG. 30.

In the example of FIG. 35, the interlayer connection portion 250 between the anode pad 174 and the separated conductive portion 70 has been described. The interlayer connection portion 250 may also be provided between the current sensing pad 172 and the separated conductive portion 71. The interlayer connection portion 250 may also be provided between the cathode pad 176 and the separated conductive portion 72.

Figure 36:
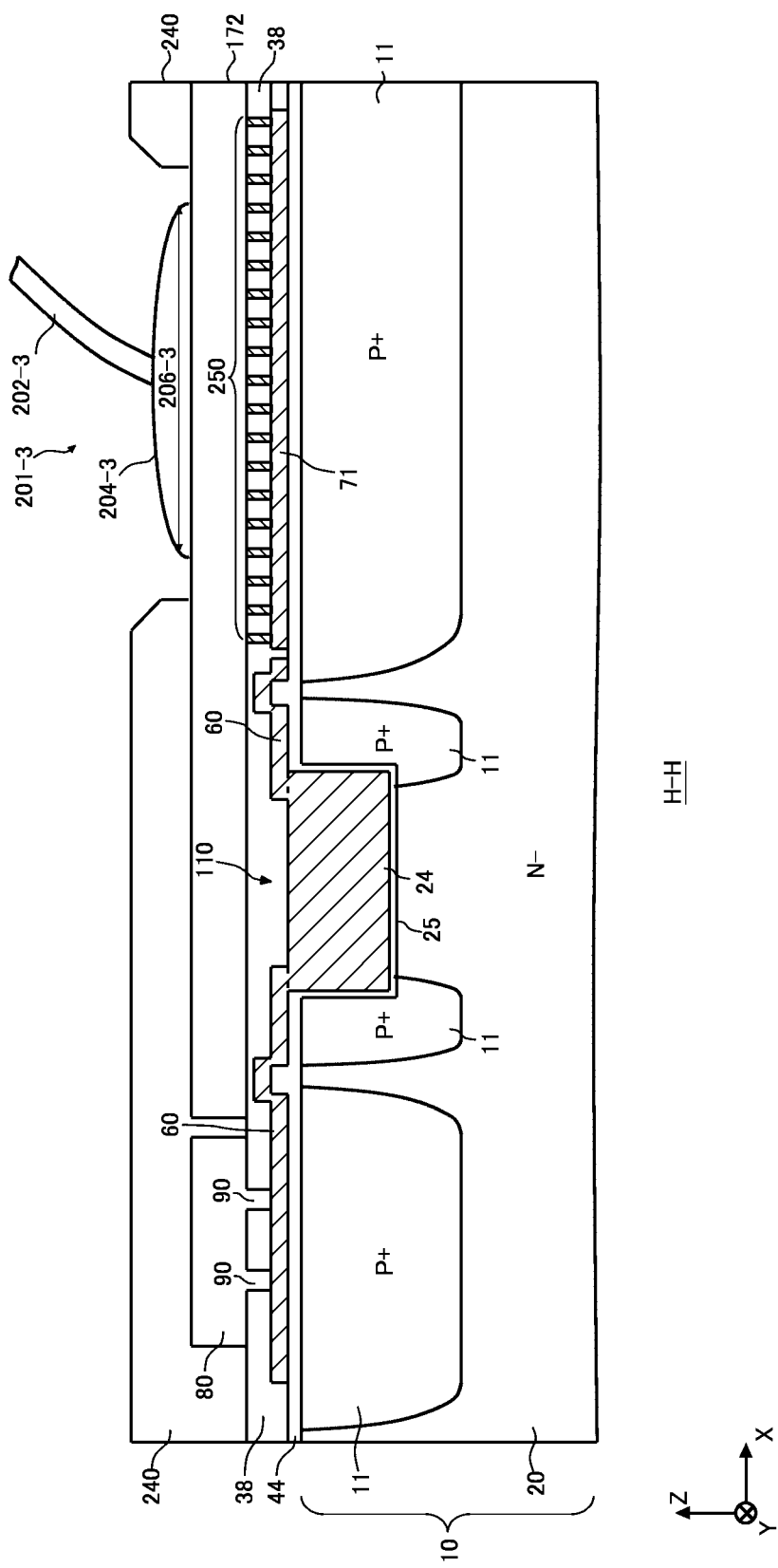
FIG. 36 is a figure showing an example of a cross section H-H in FIG. 33 and FIG. 34.

FIG. 36 is a figure showing an example of a cross section H-H in FIG. 33 and FIG. 34. The H-H cross section is an XZ plane passing through the gate metal portion 80, the current sensing region 110, and the current sensing pad 172. The gate metal portion 80 is arranged above the interlayer dielectric film 38. The gate metal portion 80 may be formed at the same height as the current sensing pad 172. The dielectric material such as the protective member 240 may be provided between the gate metal portion 80 and the current sensing pad 172.

The barrier metal layer 220 is provided on the upper surface of the interlayer dielectric film 38 and the inner wall of the through hole provided in the interlayer dielectric film 38, but is omitted in FIG. 36. That is, the barrier metal layer 220 may be provided between the gate metal portion 80 and the interlayer dielectric film 38. In addition, the interlayer dielectric film 38 is provided with the contact hole 90 for connecting the gate metal portion 80 and the gate runner 60.

The gate runner 60 extends from below the gate metal portion 80 to the current sensing region 110. The current sensing region 110 is provided with the transistor. The current sensing region 110 may be provided with the transistor having the structure shown in FIG. 2B. The gate runner 60 is connected to the gate electrode 24 of the current sensing region 110. The cross section in FIG. 36 is parallel to a longitudinal direction of the gate electrode 24 in the top plan view, and passes through the gate electrode 24. The current sensing region 110 may be surrounded by the well region 11 in the top plan view. In addition, the gate runner 60 may surround the current sensing region 110 in the top plan view.

The interlayer connection portion 250 is also provided below the current sensing pad 172. The configuration of the interlayer connection portion 250 below the current sensing pad 172 is similar to the configuration of the interlayer connection portion 250 below the anode pad 174. Note that the interlayer connection portion 250 and the separated conductive portion 71 are not provided in the region where the current sensing region 110 is provided. In addition, the separated conductive portion 71 is electrically separated from the gate runner 60 at the same potential as the current sensing pad 172.

Figure 37:
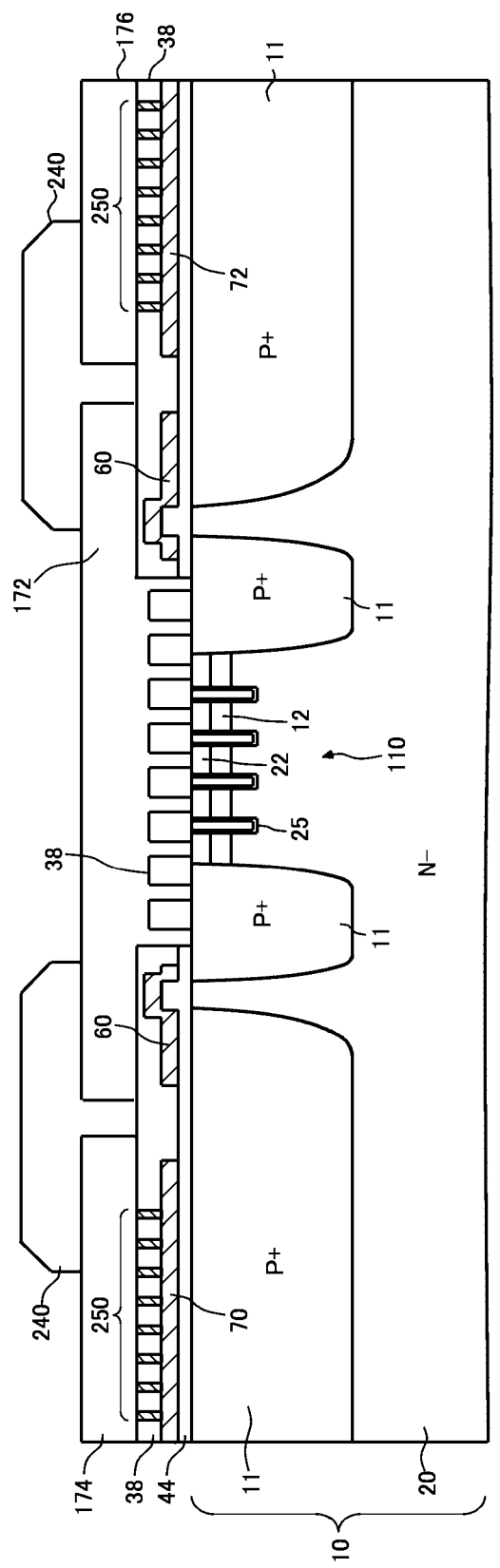
FIG. 37 is a figure showing an example of a cross section I-I in FIG. 33 and FIG. 34.

FIG. 37 is a figure showing an example of a cross section I-I in FIG. 33 and FIG. 34. The I-I cross section is a YZ plane passing through a part of the anode pad 174, the current sensing region 110, the current sensing pad 172, and a part of the cathode pad 176.

The interlayer connection portion 250 and the separated conductive portion 70 may be provided below each pad. Note that for the current sensing pad 172, the interlayer connection portion 250 and the separated conductive portion 70 are provided in a region other than the current sensing region 110.

The current sensing region 110 has the trench 25, the source region 22, and the base region 12. The gate electrode 24 is provided in the trench 25, but is omitted in FIG. 37. In addition, in FIG. 37, the contact region 23 is omitted.

The source region 22 of the current sensing region 110 is connected to the current sensing pad 172. The dielectric film 44 and the interlayer dielectric film 38 above the current sensing region 110 are provided with the through hole through which the current sensing pad 172 passes. The current sensing pad 172 is also connected to the contact region 23.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising a semiconductor substrate, the semiconductor device comprising:
   one or more sensing portions that are provided on the semiconductor substrate and that are configured to detect predetermined physical information;
   one or more sensing pad portions provided above an upper surface of the semiconductor substrate and that is connected to a corresponding one of the one or more sensing portions;
   a gate runner which is provided above the upper surface of the semiconductor substrate and to which a gate potential is applied; and
   one or more separated conductive portions in which each separated conductive portion is provided between a corresponding one of the one or more sensing pad portions and the semiconductor substrate, wherein each of the one or more separated conductive portions is separated from the gate runner, wherein each of the one or more sensing pad portions has a connection region on an upper surface thereof, wherein the connection region is configured for the connection of a corresponding wire wiring portion, wherein at least one of the one or more separated conductive portions overlaps the connection region of the corresponding one of the one or more sensing pad portions in a top plan view.

2. The semiconductor device according to claim 1, wherein
   at least some of the one or more separated conductive portions have a same thickness as the gate runner.

3. The semiconductor device according to claim 1, wherein
the one or more separated conductive portions are formed of a same material as the gate runner.

4. The semiconductor device according to claim 1, wherein
the at least one of the one or more separated conductive portions is electrically connected to the corresponding one of the one or more sensing pad portions.

5. The semiconductor device according to claim 1, wherein
a corresponding one of the one or more sensing portions, corresponding to the at least one of the one or more separated conductive portions, is configured to detect a current flowing through the semiconductor substrate.

6. The semiconductor device according to claim 5, wherein
the semiconductor substrate below the corresponding one of the one or more sensing pad portions corresponding to the at least one of the one or more separated conductive portions is provided with a transistor.

7. The semiconductor device according to claim 1, wherein
one of the one or more sensing portions is provided above the upper surface of the semiconductor substrate, and is configured to detect a temperature.

8. The semiconductor device according to claim 1, further comprising:
a wire wiring portion that is connected to the connection region of the corresponding one of the one or more sensing pad portions corresponding to the at least one of the one or more separated conductive portions.

9. The semiconductor device according to claim 8, wherein
the at least one of the one or more separated conductive portions is larger than the connection region of the corresponding one of the one or more sensing pad portions in the top plan view.

10. The semiconductor device according to claim 8, further comprising:
an interlayer dielectric film that is provided between each of the one or more separated conductive portions and the corresponding one of the one or more sensing pad portions and that has a through hole below the connection region of the corresponding one of the one or more sensing pad portions;
a tungsten portion containing tungsten that is provided inside the through hole and electrically connects each of the one or more separated conductive portions and the corresponding one of the one or more sensing pad portions; and
a barrier metal layer containing titanium that is provided to cover an upper surface of the interlayer dielectric film.

11. The semiconductor device according to claim 10, wherein
in a region below connection that overlaps the connection region of the corresponding one of the one or more sensing pad portions in the top plan view, an area of a region provided with the tungsten portion is 20% or more of an area of the region below connection.

12. The semiconductor device according to claim 10, wherein
at least a part of the through hole and the tungsten portion is provided along a first extension direction parallel to the upper surface of the semiconductor substrate.

13. The semiconductor device according to claim 12, wherein
a part of the through hole and the tungsten portion is provided along a second extension direction which is parallel to the upper surface of the semiconductor substrate and is different from the first extension direction.

14. The semiconductor device according to claim 1, further comprising:
a transistor portion provided on the semiconductor substrate; and
an emitter electrode that is provided above the upper surface of the semiconductor substrate, is connected to the transistor portion, and is separated from the one or more sensing pad portions, wherein
the one or more separated conductive portions are separated from the emitter electrode in a top plan view.

15. The semiconductor device according to claim 1, wherein
an area of the at least one of the one or more separated conductive portions provided between the corresponding one of the one or more sensing pad portions and the semiconductor substrate is 25% or more of an area of the corresponding one of the one or more sensing pad portions.

16. The semiconductor device according to claim 10, wherein
the barrier metal layer is also provided on a bottom surface of the through hole, and
the barrier metal layer covering the upper surface of the interlayer dielectric film is thicker than the barrier metal layer provided on the bottom surface of the through hole.

17. The semiconductor device according to claim 10, wherein a plurality of through holes and a plurality of tungsten portions are provided in the interlayer dielectric film below the connection region of the corresponding one of the one or more sensing pad portions corresponding to the at least one of the one or more separated conductive portions, further comprising:
an emitter electrode that is provided above the upper surface of the semiconductor substrate and that is separated from the one or more sensing pad portions, wherein
the interlayer dielectric film, a plurality of through holes, and a plurality of tungsten portions are also provided below the emitter electrode, and
an interval of the through holes in a region below connection overlapping the connection region of the corresponding one of the one or more sensing pad portions corresponding to the at least one of the one or more separated conductive portions in the top plan view is different from an interval of the through holes below the emitter electrode.

18. The semiconductor device according to claim 10, further comprising:
an emitter electrode that is provided above the upper surface of the semiconductor substrate and that is separated from the one or more sensing pad portions, wherein
the interlayer dielectric film, a through hole, and a tungsten portion are also provided below the emitter electrode, and
a width of the through hole in a region below connection overlapping the connection region of the corresponding one of the one or more sensing pad portions corresponding to the at least one of the one or more separated conductive portions in the top plan view is smaller than a width of the through hole below the emitter electrode.

19. The semiconductor device according to claim 2, wherein
the one or more separated conductive portions are formed of a same material as the gate runner.

20. The semiconductor device according to claim 2, wherein
the at least one of the one or more separated conductive portions is electrically connected to the corresponding one of the one or more sensing pad portions.

21. The semiconductor device according to claim 1, wherein
at least one of the one or more sensing pad portions is a current sensing pad having the connection region thereof,
the corresponding one of the one or more sensing portions corresponding to the current sensing pad is provided at the upper surface of the semiconductor substrate and extends below the upper surface of the semiconductor substrate, includes a transistor portion, and is a current sensing region configured to provide information regarding a current flowing in a transistor portion of an active portion of the semiconductor device,
a corresponding one of the one or more separated conductive portions that corresponds to the current sensing pad, overlaps the connection region of the current sensing pad in the top plan view,
none of the one or more separated conductive portions overlaps the current sensing region,
one or more interlayer dielectric films are provided between the current sensing pad and the current sensing region,
at least one of the one or more interlayer dielectric films is provided between the current sensing pad and the corresponding one of the one or more separated conductive portions that corresponds to the current sensing pad,
one or more through holes provided above the current sensing region and extending through the one or more interlayer dielectric films, provided between the current sensing pad and the current sensing region, allow for the current sensing pad to be conductively connected to the transistor portion of the current sensing region, and
one or more through holes provided above the corresponding one of the one or more separated conductive portions that corresponds to the current sensing pad and extending through the at least one of the one or more interlayer dielectric films, provided between the current sensing pad and the corresponding one of the one or more separated conductive portions that corresponds to the current sensing pad, allow for the current sensing pad to be conductively connected to the corresponding one of the one or more separated conductive portions that corresponds to the current sensing pad.

* * * * *